US007247514B2

(12) United States Patent
Yamane et al.

(10) Patent No.: US 7,247,514 B2
(45) Date of Patent: Jul. 24, 2007

(54) SEMICONDUCTOR DEVICE AND METHOD FOR PRODUCING THE SAME

(75) Inventors: Keiji Yamane, Akou (JP); Tetsuo Ueda, Wake-gun (JP); Takashi Miyamoto, Akaiwa-gun (JP); Isao Kidoguchi, Kawanishi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 294 days.

(21) Appl. No.: 10/819,873

(22) Filed: Apr. 6, 2004

(65) Prior Publication Data
US 2004/0201029 A1    Oct. 14, 2004

(30) Foreign Application Priority Data
Apr. 11, 2003    (JP)    ............................. 2003-108285

(51) Int. Cl.
*H01L 33/00*    (2006.01)

(52) U.S. Cl. ..................... 438/106; 438/26; 257/99; 257/777; 257/E33.056; 257/E33.057; 257/E23.023

(58) Field of Classification Search ............... 257/777, 257/99, E33.056, E33.057, E23.023; 438/26, 438/106
See application file for complete search history.

(56) References Cited
U.S. PATENT DOCUMENTS

| 5,197,654 | A | 3/1993 | Katz et al. |
| 5,234,153 | A * | 8/1993 | Bacon et al. ............ 228/122.1 |
| 5,794,839 | A | 8/1998 | Kimura et al. |
| 6,692,629 | B1 * | 2/2004 | Chen et al. ................. 205/123 |
| 6,721,342 | B2 * | 4/2004 | Yabuki et al. ................ 372/36 |
| 6,787,903 | B2 * | 9/2004 | Yang .......................... 257/734 |
| 6,878,608 | B2 * | 4/2005 | Brofman et al. ............ 438/459 |
| 2003/0067950 | A1 * | 4/2003 | Hanaoka ..................... 372/34 |

FOREIGN PATENT DOCUMENTS

| GB | 2 062 346 | 5/1981 |
| JP | 56-27988 | 3/1981 |
| JP | 63-233591 | 9/1988 |
| JP | 6-69608 | 3/1994 |
| JP | 8-181392 | 7/1996 |
| JP | 9-172224 | 6/1997 |
| JP | 11-204884 | 7/1999 |
| JP | 11-214791 | 8/1999 |

* cited by examiner

*Primary Examiner*—Evan Pert
*Assistant Examiner*—Victor A. Mandala, Jr.
(74) *Attorney, Agent, or Firm*—Hamre, Schumann, Mueller & Larson, P.C.

(57) ABSTRACT

A method for producing a semiconductor device of the present invention includes forming a surface electrode on a semiconductor element, forming a solder layer by plating on one principal surface of the surface electrode, mounting the semiconductor element on the sub-mount so that the solder layer contacts a principal surface of the sub-mount, and bonding the sub-mount and the semiconductor element to each other via the solder layer.

29 Claims, 13 Drawing Sheets

Heating

Heating

SEMICONDUCTOR DEVICE AND METHOD FOR PRODUCING THE SAME

BACKGROUND OF THE INVENTION

1. Field of the Invention

The present invention relates to a semiconductor device and a method for producing the same. In particular, the present invention relates to a semiconductor laser element device including a semiconductor laser element mounted on a sub-mount, and a method for producing the semiconductor laser element device.

2. Description of the Related Art

An optical semiconductor element (in particular, a semiconductor laser) is being put into a practical use in the fields of optical information processing and optical communication. In both the fields, there is a demand for an increase in power of a laser. However, if the power is increased, there is a problem that reliability is decreased due to heat generated by an element and the like. This makes it important to develop an element configuration and a production process capable of keeping high reliability.

For example, in order to enhance heat radiation of a semiconductor laser element, a configuration is well known in which a base to be a heat sink made of a material having a high heat conductivity, and a sub-mount made of a material having a thermal expansion coefficient close to that of the laser element are stacked successively to be bonded to each other (e.g., see JP56(1981)-27988A and JP63(1988)-233591A).

FIG. 11 is a side cross-sectional view showing a configuration of a conventional semiconductor laser device. As shown in FIG. 11, the conventional semiconductor laser device has a configuration in which a semiconductor laser element 101, a sub-mount 102, and a base 103 are stacked. The semiconductor laser element 101 has a semiconductor layered body 131, a reverse-surface electrode 107, and a surface electrode 106. The surface electrode 106 is a pattern electrode composed of a plurality of patterned layers and is formed on one surface of the semiconductor layered body 131 in which an active layer 111 is formed. The reverse-surface electrode 107 composed of a plurality of layers is formed on the other surface of the semiconductor layered body 131. In FIG. 11, a light-emission point 112 of the semiconductor laser element is shown.

Furthermore, the sub-mount 102 includes an electrical insulating material 132, a surface electrode 108, a solder layer 104, a reverse-surface electrode 109, and a solder layer 105. On one surface of the electrical insulating material 132, the surface electrode 108 composed of a plurality of layers and the solder layer 104 are formed in this order. On the other surface of the electrical insulating material 132, the reverse-surface electrode 109 composed of a plurality of layers and the solder layer 105 are formed in this order.

Furthermore, the base 103 has a radiator 133 and an Au-plating layer 110. The Au-plating layer 110 is formed on the surface of the radiator 133.

Referring to FIG. 9, the semiconductor laser element 101 and the sub-mount 102 are bonded to each other by melting of the solder layer 104 therebetween. The sub-mount 102 and the base 103 are bonded to each other by melting of the solder layer 105 therebetween. Consequently, the semiconductor laser device shown in FIG. 11 is formed.

In the case where the driving current of the conventional semiconductor laser element 101 is in a wide current range of, for example, tens of mA to hundreds of mA, the amount of heat generation is increased. Therefore, a metallic radiator made of Cu or the like covered with a metal film 110 or the like in which Au-plating is formed on Ni-plating is used. Furthermore, the sub-mount 102 is made of a material having a thermal expansion coefficient close to that of the semiconductor laser element 101 in view of the connection process such as melting and bonding of the solder layers 104, 105, and the influence of heat generation during an operation of the semiconductor laser device.

Examples of the material for the solder layer 104 generally include an alloy of Au and Sn (hereinafter, referred to as an "AuSn alloy"), an alloy of Ag and Sn (hereinafter, referred to as an "AgSn alloy"), PbSn, AuSi, AuGe, AuZe, InSb, and the like. In particular, the AuSn alloy is used often in the semiconductor laser device due to its excellent corrosion resistance, high-temperature strength, and thermal shock resistance, and its small specific resistance.

In particular, the AuSn alloy and the AgSn alloy exhibit the effect of bonding at a low temperature due to a low melting point. For example, the melting point of Au is 1063° C.; however, by mixing Sn with Au, the melting point of Au is remarkably decreased, and in an eutectic composition of Au (80 wt %)-Sn (20 wt %), the melting point of Au is decreased to an eutectic point of 278° C. When the content of Sn is equal to or more than 20 wt %, the melting point of Au tends to increase gradually.

The melting point of Ag also is remarkably decreased by being mixed with Sn, and in an eutectic composition of Ag (3.5 wt %)-Sn (96.5 wt %), the melting point of Ag is decreased to an eutectic point of 221° C. Thus, the AgSn alloy enables mounting at a temperature lower than that of the AuSn alloy. When the content of Sn is equal to or more than 96.5 wt %, the melting point of Ag tends to increase gradually.

In mounting of the semiconductor laser element 101, bonding at a lower temperature is required for the following reason. Hereinafter, the case where the AuSn alloy is used as a material for a plating layer will be described. The surface electrode 106 provided on the semiconductor laser element 101 and the surface electrode 108 provided on the surface of the sub-mount 102 are made of a plating layer whose surface mainly contains Au. When the surface electrodes 106 and 108 are connected by heating via the solder layer 104, the AuSn alloy contained the solder layer 104 and Au contained in the electrodes 106 and 108 are alloyed to be integrated, whereby the surface electrodes 106 and 108 are bonded to each other via the solder layer 104. When the temperature is decreased to room temperature after connecting the surface electrodes 106 and 108, stress accumulates in the semiconductor laser element 101 due to a change in size of both materials caused by the difference in thermal expansion coefficient between the semiconductor laser element 101 and the sub-mount 102. This stress strains the semiconductor laser element 101, which greatly degrades the reliability of the semiconductor laser element 101.

Therefore, as the material for the sub-mount 102, SiC, AlN, diamond, Mo, or the like having physical property values (e.g., a thermal expansion coefficient, Young's modulus, etc.) close to those of the material for the semiconductor laser element 101 is selected. Furthermore, in order to reduce thermal stress, bonding at a lower temperature is required, and a solder material having a low melting point is selected for the solder layer 104.

In connection between the solder layer 104 made of an AuSn alloy and the surface electrodes 106 and 108, in the case where the content of Sn with respect to the total amount of Au of the alloy formed by the connection is an eutectic composition of Au(80 wt %)-Sn(20 wt %), bonding at a lowest melting point is made possible. However, in the case where a shift from the eutectic composition occurs, the melting point is increased. Thus, when the bonding temperature is set in accordance with the lowest melting point, the AuSn alloy of the solder layers 104 and 105 is not melted, or sufficient bonding strength cannot be obtained even if it is melted. When the bonding temperature is increased so as to avoid this, thermal stress is increased and causes strain. Because of this, it is important to control the content of Sn with respect to the total amount of Au in the surface electrodes 106, 108 and the solder layer 104.

Hereinafter, a method for forming the solder layer 104 of the AuSn alloy will be described. A first forming method is based on vapor deposition. The first forming method includes a method for stacking an Au layer and a Sn layer alternately to a desired thickness, using Au and Sn as respective vapor deposition sources (e.g., see JP6(1994)-69608A), and a method for forming an AuSn layer to a desired thickness, using an AuSn alloy that has been controlled for a composition as a vapor deposition source (e.g., see JP8(1996)-181392A). According to these methods, the thicknesses of the Au layer and the Sn layer, and the compositions thereof can be controlled by the thickness precision enabled by vapor deposition.

However, in order to obtain stable bonding strength, the thickness of the solder layer 104 desirably is 1 μm or more. In order to obtain the desired thickness, the film-formation time is prolonged, and the amount of a vapor deposition material is increased, which leads to an increase in cost.

A second method is to form an Au layer and a Sn layer by plating. According to this method, an Au-plating layer and a Sn-plating layer are stacked successively, and then, the stack is heated to form the solder layer 104 of an AuSn alloy. Alternatively, an Au-plating layer is formed on one opposed surface between the semiconductor laser element 101 and the sub-mount 102 to be bonded, and a Sn-plating layer is formed on the other opposed surface therebetween; they are heated under the condition that they are in contact, whereby the semiconductor laser element 101 is bonded to the sub-mount 102 (e.g., see JP11(1999)-204884A). According to this method, a thick layer can be obtained in a short period of time. Therefore, the solder layer 104 can be produced at a cost lower than that of the method using vapor deposition.

Next, mounting of the semiconductor laser element 101 on the sub-mount 102 will be described.

Generally, the semiconductor laser element 101 is mounted on the sub-mount 102 by a Junction-down (hereinafter, referred to as "J-down") method in most cases. According to the J-down method, the surface electrode 106 side of the semiconductor laser element 101 is bonded to the sub-mount 102. In the semiconductor laser element 101, the active layer 111 is formed on a side dose to the surface electrode 106. According to the J-down method, the semiconductor laser element 101 is bonded to the sub-mount 102 in such a manner that the surface electrode 106 on a side close to the active layer 111 generating heat is positioned dose to the base 103 that is a radiator. This allows the heat generated by the active layer 111 to diffuse to the sub-mount 102 smoothly. Therefore, the heat radiation of the semiconductor laser device can be enhanced.

However, in the case of the J-down method, the interval between the active layer 111 including the light-emission point 112 and the sub-mount 102 is several μm. Therefore, the solder layer 104 melted in the course of connection may come around the side wall portion of the semiconductor laser element 101 to cause a short-circuit defect, and may cover the light-emission point 112 to block laser light.

Therefore, as shown in FIG. 9, in most cases, the area for forming the solder layer 104 is patterned so as to be smaller than the contour of the semiconductor laser element 101. However, even with such a configuration, when a positional shift occurs in the course of arranging the semiconductor laser element 101 on the sub-mount 102, the solder material for the solder layer 104 may come around the side wall surface of the semiconductor laser device 101.

FIG. 10 shows each component before bonding for another conventional semiconductor laser device. FIG. 10 is different from FIG. 9 in that the solder layer 104 is not formed on the surface electrode 108 of the sub-mount 102, but is formed on the surface electrode 106 of the semiconductor laser element 101.

As shown in FIG. 10, in the case where the solder layer 104 is formed on the semiconductor laser element 101 side, even when a positional shift occurs in the course of mounting, the solder material for the solder layer 104 is unlikely to come around the side wall surface of the semiconductor laser element 101. Furthermore, in the case of using a two-wavelength laser element, a GaN laser element, or the like as the semiconductor laser element 101, the surface electrode 106 is composed of two or more pattern electrodes having the same thickness, and their electrode interval is small (i.e., about 100 μm). However, even in such a case, the solder layer 104 does not spread more than necessary, so that a short-circuit defect caused by the interval of the pattern electrodes can be prevented.

Furthermore, the advantages in the case where the solder layer 104 is formed on the semiconductor laser element 101 side will be described with reference to FIGS. 12A to 12C and FIGS. 13A to 13D. FIGS. 12A to 12C are views respectively illustrating an example of a mounting process for a semiconductor laser element in the case where a solder layer is formed on a sub-mount side.

First, as shown in FIG. 12A, the sub-mount 102 is held on a needle-shaped adsorbing collet 129, and placed at a predetermined position on the base 103. Next, as shown in FIG. 12B, the semiconductor laser element 101 is held by another adsorbing collet 130, and placed at a predetermined position on the sub-mount 102. Next, as shown in FIG. 12C, the resultant stack is heated to raise the temperature to melting points of the solder layers 104 and 105. Consequently, the solder layers 104 and 105 are melted simultaneously, and the base 103 and the sub-mount 102, and the semiconductor laser element 101 are bonded to each other simultaneously.

FIGS. 13A to 13D are views respectively illustrating an example of a mounting process for a semiconductor laser element in the case where a solder layer is formed on the semiconductor laser element side. First, as shown in FIG. 13A, the sub-mount 102 is held by the needle-shaped adsorbing collet 129, and placed at a predetermined position on the base 103. Then, the resultant stack is heated as shown in FIG. 13B to raise the temperature to the melting point of the solder layer 105, whereby the solder layer 105 is melted, and the base 103 is bonded to the sub-mount 102. Next, as shown in FIG. 13C, the semiconductor laser element 101 is held by another adsorbing collet 130, and placed at a predetermined position on the sub-mount 102. Next, as shown in FIG. 13D, the resultant stack is heated to raise the temperature to the melting point of the solder layer 104. Consequently, the solder layer 104 is melted, whereby the sub-mount 102 and the semiconductor laser device 101 are bonded to each other. It also may be possible for the sub-mount 102 to be bonded to the semiconductor laser element 101, and the resultant stack then bonded to the base 103 to produce a semiconductor laser device.

In such a production process, when the temperature is raised to the melting point of the solder layer 104 in bonding between the semiconductor laser element 101 and the sub-mount 102, in most cases, the stack is heated under the condition of being supplied with a load of about 10 g by the adsorbing collet 129 or 130 so that the semiconductor laser element 101 and the sub-mount 102 are not shifted from predetermined positions.

According to the method shown in FIGS. 13A to 13D, the steps shown in FIGS. 13A and 13B, and the steps shown in FIGS. 13C and 13D can be performed simultaneously at different positions. In this case, compared with the method shown in FIGS. 12A to 12C, there is an advantage of a high production efficiency. Furthermore, immediately after the sub-mount 102 and the semiconductor laser element 101 are placed at respective predetermined positions, they are bonded to each other, so that there also is an advantage of a high positional precision.

On the other hand, in the case where the solder layer 104 is formed on the sub-mount 102 side as shown in FIG. 12A, when the semiconductor laser element 101 is bonded to the sub-mount 102 after the base 103 is bonded to the sub-mount 102, there is the following problem. The surface of the solder layer 104 on the sub-mount 102 is placed at a predetermined position on the base 103 while being held by the adsorbing collet 129. Furthermore, the resultant stack is heated in that state. Therefore, the solder layer 104 also is melted at the same time as the melting of the solder layer 105, and a mark of the adsorbing collet 129 is formed on the surface of the solder layer 104 to generate level difference. Furthermore, there is a problem that a solder material adheres to the end of the adsorbing collet 129, and the like. When the solder layer 104 is melted in the course of bonding between the base 103 and the sub-mount 102, Au in the surface electrode 108 diffuses to increase the melting point thereof and the surface electrode 108 may be oxidized. Therefore, the temperature required thereafter for bonding the semiconductor laser element 101 to the sub-mount 102 via the solder layer 104 becomes high.

In order to solve these problems, the following is proposed: solder materials having different melting points are used for the solder layers 104 and 105, and the composition ratio of the same solder material is varied (e.g., JP11(1999)-214791A and JP9(1997)-172224A). According to these methods, along with an increase in steps, there is a possibility that the cost of the sub-mount 102 may be increased, and the bonding temperature and solder composition may be varied.

On the other hand, in the case where the solder layer 104 is formed on the semiconductor laser element 101 side as in the method shown in FIGS. 13A to 13D, the solder layer 104 is not formed on the opposed sub-mount 102 surface. Therefore, even if the sub-mount 102 is adsorbed and held by the adsorbing collet 129, and heating is performed while a load is applied, the mark of the adsorbing collet is not formed on the solder layer 104, and the solder layer 104 does not adhere to the adsorbing collet 129. However, in the case where the semiconductor laser element 101 with the solder layer 104 formed thereon is mounted on the sub-mount 102, the following problem arises. For example, as disclosed in JP11(1999)-204884A, when the solder layer 104 made of an AuSn alloy or the like is formed by plating, a thick film is obtained in a shorter period of time, compared with the vapor deposition method. However, the AuSn alloy layer or the like is formed after previously performing heat treatment, so that the number of steps is increased. Furthermore, since each layer is thick, there is a problem that the composition after alloying is not uniform in a layer, and stress is increased due to the variation in a melting point, the variation in a composition, and the segregation of Sn. Furthermore, JP11(1999)-204884A proposes a method for forming a paired layer including a thin Au-plating layer and a thin Sn-plating layer repeatedly, and controlling the total thickness of the Sn-plating and Au-plating. However, according to this method, the operation time is prolonged in the same way as in the case of vapor deposition.

Furthermore, as described with reference to FIG. 10, since the solder layer 104 is formed on the semiconductor laser element 101 side, there are advantages that a solder material can be prevented from coming around the side wall surface of the semiconductor laser element 101, a mounting method with a high production efficiency is applicable, and the like, as described above. On the other hand, there is a problem in cleavage processing.

Cleavage processing refers to an operation in which, when the semiconductor laser element 101 is produced, a plurality of semiconductor laser elements 101 are formed as a single unit, and then, the unit is divided into individual semiconductor laser elements 101. Hereinafter, the cleavage processing and problems caused therein will be described with reference to the drawings. FIGS. 14A to 14C are views respectively illustrating the steps of cleavage processing of a semiconductor laser element. As shown in FIG. 14A, a plurality of semiconductor layers each including an active layer are stacked successively on a semiconductor substrate, whereby a plurality of semiconductor layered bodies 131 formed as a single unit are provided. Furthermore, on the surface of the semiconductor layered bodies 131 on which the semiconductor layers are formed, a plurality of grooves 121 for cleavage are formed in parallel to each other at an equal interval for each interval of the semiconductor laser elements 101 in a resonator length direction (X direction in FIGS. 14A to 14C) of the semiconductor laser element 101 (see FIG. 10). Next, over the entire surfaces of the semiconductor layer uppermost portions of the semiconductor layered bodies 131, the surface electrodes 106 patterned in a lattice shape are provided in portions excluding cleavage regions, and the reverse-surface electrodes 107 are provided over the entire reverse surfaces of the semiconductor layered bodies 131. On each surface-electrode 106, the solder layer 104 made of an AuSn alloy is formed. The solder layer 104 is formed in a region narrower than the surface electrode 106, so that a part of the surface electrode 106 is exposed so as to surround the semiconductor layer 104. In order to cut out the semiconductor layered bodies 131 in a rectangular shape with a Y direction being a longitudinal direction, a plurality of short scribe points 122 are formed at an equal interval on each side edge in the resonator direction of the semiconductor layered bodies 131 in a rectangular shape.

Then, as shown in FIG. 14B, the semiconductor layered bodies 131, the surface electrodes 106, and the reverse-surface electrodes 107, which are formed as a single unit, are cleaved (primary cleavage) in the Y direction, using each scribe point 122 (see FIG. 14A) provided on the semiconductor layered bodies 131 cut out in a rectangle as a starting point, a plurality of bar-shaped element connected bodies 123 are obtained.

Next, as shown in FIG. 14C, each bar-shaped element connected body 123 (see FIG. 14B) is cleaved (secondary cleavage) along the grooves 121 for cleavage, whereby a plurality of semiconductor laser elements 101 are obtained.

Each semiconductor laser element 101 includes the surface electrode 106 on the front surface of the semiconductor layered body 131, and the reverse-surface electrode 107 on the reverse surface thereof. Furthermore, the solder layer 104 is provided on the surface electrode 106. A voltage is applied between the surface electrode 106 and the reverse-surface electrode 107, whereby laser light is output from an end face formed by primary cleavage.

In the above-mentioned process, in primary cleavage and secondary cleavage, generally, a pattern is recognized using the difference in reflection of light between the regions of the surface electrodes 106 and the other regions by irradiating the surfaces of the semiconductor layered bodies 131 with light, and a cleavage angle and a cleavage position can be adjusted from the recognized pattern. Particularly in primary cleavage, when the crystal direction of the semiconductor layered body 131 is not matched with the cleavage direction, the cleavage surface is not matched with the crystal surface. Therefore, level differences and scars are formed on an end face, and the end face does not function as an end face mirror. Furthermore, laser light is eclipsed, which substantially degrades characteristics.

In order to solve this problem, by increasing the difference in reflectance between the regions of the surface electrodes 106 and the other regions (e.g., the solder layer 104), the recognition ratio of the surface electrodes 106 is enhanced. For example, the surfaces of the surface electrodes 106 or the surfaces of the other regions are roughened with an etchant or the like to decrease flatness, and the like.

However, the AuSn alloy used in the solder layer 104 has very high flatness, and also has resistance to an etchant. Therefore, it is difficult to form unevenness on the surface. Thus, the clear difference in reflectance between the surface electrodes 106 and the other regions is not obtained, and pattern recognition cannot be performed satisfactorily. Furthermore, even after the primary cleavage, there are a number of steps of recognizing the pattern of the surface electrodes 106, aligning them, and defining the direction thereof, so that similar problems arise.

On the other hand, since the AuSn solder layer is dark green, the difference in color under visible light between the surfaces of the surface electrodes 106 and those of the other regions (e.g., the surfaces on which Pt is exposed) is clear. Therefore, if pattern recognition is performed by color extraction or the like, the above-mentioned problem may be solved. However, according to this method, the recognition property is unstable, and an apparatus having a color identification capability is expensive.

SUMMARY OF THE INVENTION

Therefore, with the foregoing in mind, it is an object of the present invention to provide a highly reliable semiconductor device capable of enhancing a processing yield and productivity, and a method for producing the same.

A method for producing a semiconductor device of the present invention includes: forming a surface electrode on a semiconductor element; forming a solder layer by plating on one principal surface of the surface electrode; placing the semiconductor element on a sub-mount so that the solder layer contacts a principal surface of the sub-mount; and bonding the sub-mount and the semiconductor element to each other via the solder layer.

A semiconductor device of the present invention having a sub-mount and a semiconductor element bonded to each other via a solder layer, includes: a surface electrode formed on a principal surface of the semiconductor element on the sub-mount side; the solder layer partially formed on the surface electrode; and a covering layer formed over an entire surface of the solder layer, wherein a part of the surface electrode is exposed.

These and other advantages of the present invention will become apparent to those skilled in the art upon reading and understanding the following detailed description with reference to the accompanying figures.

DESCRIPTION OF THE PREFERRED EMBODIMENTS

Figure 1:
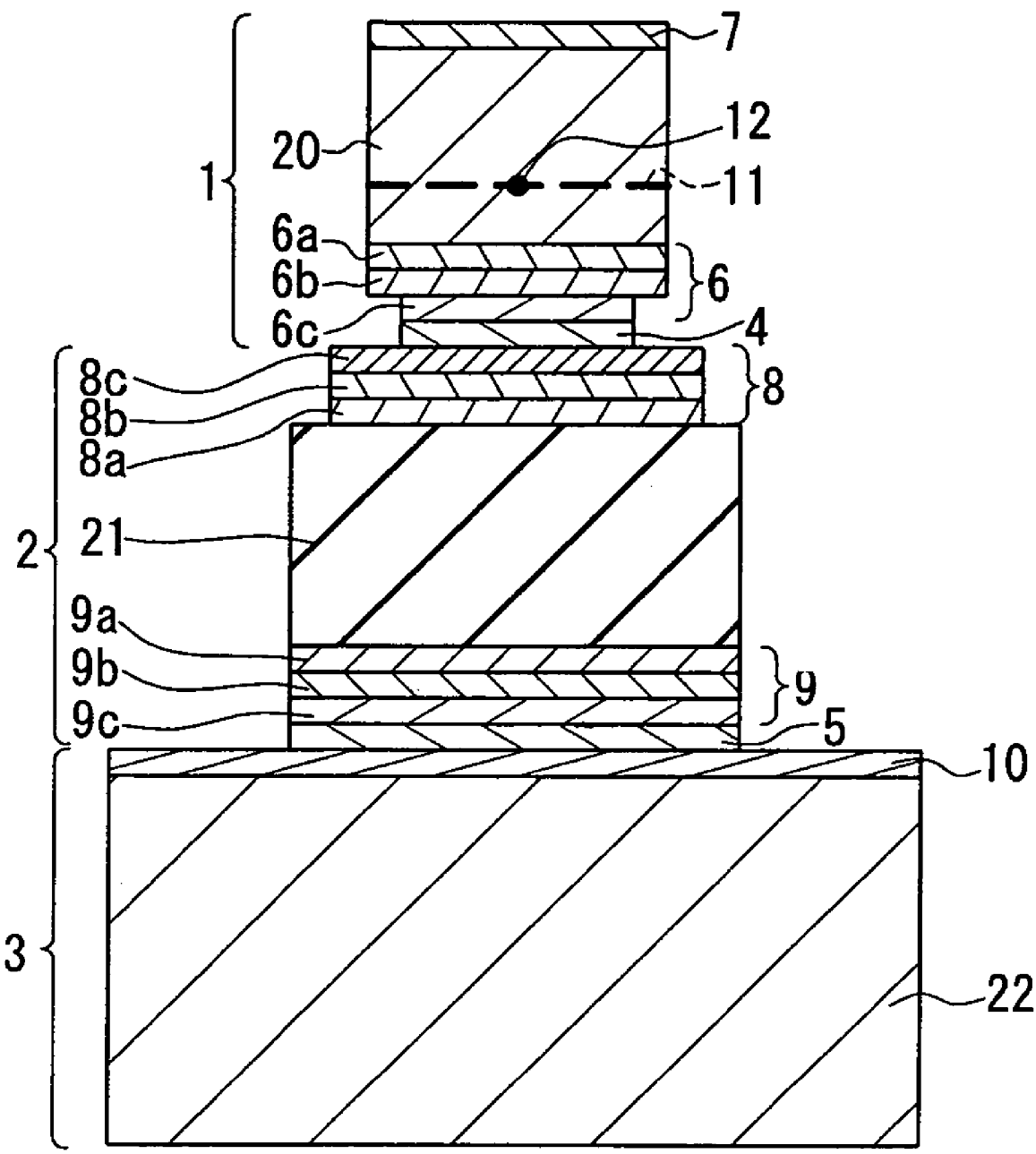
FIG. 1 is a side cross-sectional view showing a stack configuration of a semiconductor laser device according to Embodiment 1 of the present invention.

A method for producing a semiconductor device of an embodiment according to the present invention includes: forming a surface electrode on a semiconductor element; forming a solder layer by plating on one principal surface of the surface electrode; placing the semiconductor element on a sub-mount so that the solder layer contacts a principal surface of the sub-mount; and bonding the sub-mount and the semiconductor element to each other via the solder layer. According to this configuration, it is possible to produce a semiconductor device at a low temperature. Furthermore, a mark or the like of an adsorbing collet does not remain on the solder layer, and solder does not adhere to the adsorbing collet. Furthermore, the solder layer does not come around the side wall portion of the semiconductor element. Thus, the reliability of the semiconductor device is not decreased.

Furthermore, preferably, when the sub-mount and the semiconductor element are bonded to each other, the solder layer is not formed on the sub-mount. According to this configuration, a mark or the like of an adsorbing collet does not remain on the solder layer, and solder does not adhere to the adsorbing collet. Furthermore, the solder layer does not come around the side wall portion of the semiconductor element.

Furthermore, preferably, the solder layer is partially formed on the surface electrode, the surface electrode has an exposed portion, and before mounting the semiconductor element on the sub-mount, a covering layer having a flatness different from that of the surface electrode is formed on the solder layer. According to this configuration, pattern recognition of the surface electrode and the covering layer can be performed easily, whereby the semiconductor element can be positioned with a high precision. Furthermore, cleavage processing can be performed easily in the course of the production of the semiconductor element.

Furthermore, preferably, the solder layer contains an alloy of Au and Sn. According to this configuration, the semiconductor element can be mounted at a low temperature. Therefore, the semiconductor element is not strained due to heat during bonding, and the reliability of the semiconductor element is not decreased.

Furthermore, preferably, after the solder layer made of plating of the alloy of Au and Sn is formed, an Au-rich layer is formed on a surface of the solder layer by plating, and the Au-rich layer is subjected to etching treatment so as to be made rough. According to this configuration, the flatness of the surface of the solder layer can be decreased, whereby pattern recognition of the semiconductor element can be performed easily. The surface roughness of the Au-rich layer may be 0.01 μm or more, and desirably 0.05 μm Furthermore, preferably, the solder layer made of the plating of the alloy of Au and Sn is formed by allowing a current to flow through the surface electrode soaked in a plating liquid, a composition of the alloy of Au and Sn is changed by adjusting a current density in the plating liquid, and an Au-rich layer is formed as a covering layer on the surface of the solder layer. According to this configuration, the Au-rich layer can be formed easily.

Furthermore, preferably, the thickness of the Au-rich layer after the etching treatment is 0.02 μm or more. This can prevent the solder layer from being oxidized.

Furthermore, preferably, the Au-rich layer contains Au in an amount of 90 wt % or more. According to this configuration, sufficient unevenness is formed on the surface of the Au-rich layer. Therefore, pattern recognition of the semiconductor element can be performed easily.

Furthermore, preferably, the etching treatment includes impregnating the Au-rich layer with a mixture of iodine and water, and roughening a surface of the Au-rich layer. According to this configuration, the flatness of the Au-rich layer can be decreased.

Furthermore, preferably, the solder layer contains an alloy of Ag and Sn. According to this configuration, it is possible to produce the semiconductor device at a low temperature. Therefore, the semiconductor element is not strained due to heat during bonding, and the reliability of the semiconductor element is not decreased.

Furthermore, preferably, after the solder layer made of the plating of the alloy of Ag and Sn is formed, an Au-rich layer is formed on a surface of the solder layer, and etching treatment is performed so as to roughen a surface of the Au-rich layer. According to this configuration, the flatness of the surface of the solder layer can be decreased, whereby pattern recognition of the semiconductor element can be performed easily.

Furthermore, the Au-rich layer may be formed by plating.

Furthermore, the Au-rich layer may be formed by vapor deposition.

Furthermore, preferably, the thickness of the Au-rich layer after the etching treatment is 0.02 μm or more. This can prevent the solder layer from being oxidized.

Furthermore, preferably, the Au-rich layer contains Au in an amount of 90 wt % or more. According to this configuration, sufficient unevenness is formed on the surface of the Au-rich layer. Therefore, pattern recognition of the semiconductor element can be performed easily.

Furthermore, the above-mentioned method may include, before mounting the semiconductor element on the sub-mount, bonding a base and the sub-mount to each other via a solder layer for a base.

Furthermore, preferably, the solder layer for a base is formed on one of the sub-mount and the base, a plating layer containing Au is formed on the other of the sub-mount and the base in a case where the solder layer for a base contains an alloy of Au and Sn, and a plating layer containing Ag is formed on the other of the sub-mount and the base in a case where the solder layer for a base contains an alloy of Ag and Sn, and in order to bond the base and the sub-mount to each other, heating is performed so that the solder layer for a base and the plating layer are melted. According to this configuration, even if the solder layer for bonding the semiconductor element and the sub-mount to each other and the solder layer for a base for bonding the sub-mount and the base to each other are made of the same material, respective bonding steps can be performed separately due to the difference in a melting point therebetween. Therefore, the operation efficiency is enhanced.

Furthermore, the above-mentioned method may include bonding a base and the sub-mount to each other via the solder layer for a base, after bonding the sub-mount and the semiconductor element to each other via the solder layer.

Furthermore, the semiconductor element may be a semiconductor laser element.

Furthermore, preferably, the surface electrode is formed on a side of the semiconductor laser element on which an active layer is formed. According to this configuration, a semiconductor device with a high heat radiation efficiency can be produced.

Furthermore, preferably, the surface electrode includes a plurality of layers, and the above-mentioned method further includes forming a barrier layer for preventing metal contained in the solder layer from diffusing into the semiconductor element, as at least one layer of the surface electrodes. According to this configuration, a semiconductor device with high reliability can be produced.

In the semiconductor device of the present invention, high-precision alignment is performed, so that reliability is high.

Furthermore, preferably, the solder layer contains an alloy of Au and Sn, and a content of Sn with respect to a total amount of Au is in the vicinity of 20 wt %. According to this configuration, the sub-mount and the semiconductor element are bonded to each other at a low temperature. Therefore, the semiconductor device has high reliability.

Furthermore, preferably, the solder layer contains an alloy of Ag and Sn, and a content of Sn with respect to a total amount of Ag is in the vicinity of 95 wt %. According to this configuration, the sub-mount and the semiconductor element are bonded to each other at a low temperature. Therefore, the semiconductor device has high reliability.

Furthermore, the covering layer is made of an Au-rich layer. According to this configuration, the semiconductor element is positioned with a high precision. Therefore, the semiconductor device has high reliability.

Furthermore, preferably, the Au-rich layer contains Au in an amount of 90 wt % or more. According to this configuration, sufficient unevenness is formed on the surface of the Au-rich layer. Therefore, the semiconductor element is positioned with a high precision, and the semiconductor device has high reliability.

Furthermore, preferably, a region for forming the solder layer on the surface electrode is inside of a surface of the semiconductor element where the surface electrode is formed. According to this configuration, the solder layer does not come around the side wall portion of the semiconductor element, and the reliability of the semiconductor element is not decreased.

Furthermore, the semiconductor element may be a semiconductor laser element.

Furthermore, preferably, in the semiconductor laser element, an active layer emitting laser light is formed on the surface electrode side. According to this configuration, the active layer generating heat is positioned close to the sub-mount, and provides high heat radiation efficiency.

Furthermore, preferably, the above-mentioned semiconductor device further includes a base that is a radiator, wherein the sub-mount and the semiconductor element are stacked successively and bonded to each other on the base. According to this configuration, a heat radiation efficiency is high.

Furthermore, preferably, the surface electrode includes a plurality of layers, and at least one layer of the surface electrodes is a barrier layer for preventing metal contained in the solder layer from diffusing into the semiconductor element. According to this configuration, the reliability of the semiconductor element can be prevented from being decreased.

Hereinafter, the present invention will be described by way of further specific embodiments with reference to the drawings.

Embodiment 1

A semiconductor device and a method for producing the same according to Embodiment 1 of the present invention will be described with reference to the drawings. In Embodiment 1, as a semiconductor device of the present invention, a semiconductor laser device with a semiconductor laser element mounted on a sub-mount will be illustrated. However, the present invention is not limited thereto. Another semiconductor element may be mounted on a sub-mount.

FIG. 1 is a side cross-sectional view showing a stack configuration of a semiconductor laser device according to Embodiment 1 of the present invention. The semiconductor laser device according to Embodiment 1 of the present invention includes a semiconductor laser element 1, a sub-mount 2, and a base 3. The semiconductor laser element 1 is bonded to the sub-mount 2 with a solder layer 4, and the sub-mount 2 is bonded to the base 3 with a solder layer 5.

The semiconductor laser element 1 is a high-power red semiconductor laser with a resonator length of 800 μm, a chip width of 300 μm, and a thickness of 100 μm. The surface side of the semiconductor laser element 1 on which a semiconductor layer including an active layer 11 is formed is to be bonded to the sub-mount 2 by the J-down method. According to the J-down method, a surface electrode 6 on a side close to the active layer 11 is to be bonded to the sub-mount 2. Therefore, the active layer 11 that generates heat is placed closer to the base 3 that is a radiator, which enhances the heat radiation efficiency of the semiconductor laser device.

Furthermore, the semiconductor laser device 1 includes a semiconductor layered body 20, the surface electrode 6, the solder layer 4, and a reverse-surface electrode 7. On the surface side of the semiconductor layered body 20, a Cr layer 6a (thickness: 0.05 μm), a Pt layer 6b (thickness: 0.1 μm), an Au layer 6c (thickness: 0.05 μm), and the solder layer 4 (thickness: 3 μm) mainly containing an AuSn alloy are stacked in this order. The components other than Au and Sn contained in the solder layer 4 may be selected from Cu, Zn, and the like, for example.

Herein, the Cr layer 6a, the Pt layer 6b, and the Au layer 6c are formed over the entire surface of the semiconductor laser element 1 to form the surface electrode 6. Furthermore, the solder layer 4 containing an AuSn alloy is formed in a region set 20 μm inside from the four sides of the surface of the semiconductor laser element 1. The solder layer 4 is not limited to a rectangle, and may have an island shape or a comb shape. Furthermore, the Pt layer 6b also plays a role as a barrier layer for preventing Au and Sn in the solder layer 4 and Au in the Au layer 6c from diffusing into the semiconductor laser element 1.

Furthermore, the composition of the solder layer 4 is controlled so that the content of Sn with respect to the total amount of Au is in the vicinity of 20%. Furthermore, a reverse-surface electrode 7 composed of a plurality of layers is formed over the entire reverse surface of the semiconductor laser element 1.

The thickness of the solder layer 4 preferably is in a range of 1 μm to 10 μm. When the thickness of the solder layer 4 is less than 1 μm, it is difficult to obtain sufficient adhesion strength between the semiconductor laser element 1 and the sub-mount 2. Furthermore, when the thickness of the solder layer 4 exceeds 10 μm, there is a possibility that a solder material comes around the side wall portion of the semiconductor laser element 1 in the course of mounting the semiconductor laser element 1. As long as the thickness of the solder layer 4 is in a range of 1 μm to 10 μm, sufficient adhesion strength is obtained between the semiconductor laser element 1 and the sub-mount 2, and a solder material does not come around the side wall portion of the semiconductor laser element 1.

Furthermore, if the solder layer 4 is formed in a region set 20 μm inside from the four sides of the surface of the semiconductor laser element 1, a solder material does not extend off the surface of the semiconductor laser element 1 in the course of mounting. Furthermore, the solder layer 4 may be formed in such a range that a solder material does not extend off the surface of the semiconductor laser element 1 in the course of mounting. For example, the solder layer 4 may be formed in a region set 10 μm inside from the four sides of the surface of the semiconductor laser element 1. If the pattern shape of the solder layer 4 is large, the contact area between the solder layer 4 and the sub-mount 2 also is large, which makes it possible to enhance heat radiation further.

Furthermore, it is preferable that the content of Sn with respect to the total amount of Au in the solder layer 4 is in the vicinity of 20 wt %. In this case, the semiconductor laser element 1 can be mounted at a low temperature (i.e., 300° C. or less). Even if the content of Sn with respect to the total amount of Au is in a range of 18 wt % to 26 wt %, the mounting temperature of the semiconductor laser element 1 can be set to be 350° C. or less.

The sub-mount 2 has an electrical insulating material 21 with a high heat conductivity, a surface electrode 8, a reverse-surface electrode 9, and the solder layer 5. For example, the electrical insulating material 21 is made of SiC, and has a thickness of 300 μm. On the surface of the sub-mount 2 to which the semiconductor laser element 1 is to be bonded, the surface electrode 8 is formed. The surface electrode 8 is composed of a Ti layer 8a, a Pt layer 8b, and an Au layer 8c, and the Ti layer 8a (thickness: 0.1 μm), the Pt layer 8b (thickness: 0.2 μm), and the Au layer 8c (thickness: 0.05 μm) are stacked in this order on the surface of the sub-mount 2. Furthermore, on the surface (reverse surface) of the sub-mount 2 to be bonded to the base 3, the reverse-surface electrode 9 is formed, and the solder layer 5 further is formed. The reverse-surface electrode 9 is composed of a Ti layer 9a, a Pt layer 9b, and an Au layer 9c. The Ti layer 9a (thickness: 0.1 μm), the Pt layer 9b (thickness: 0.2 μm), the Au layer 9c (thickness: 0.05 μm), and the solder layer 5 (thickness: 3 μm) containing an AuSn alloy are stacked in this order on the reverse surface of the sub-mount 2. These layers are formed over the entire reverse surface. Herein, the solder layer 5 may be made of a solder other than an AuSn alloy, an Ag paste, or the like.

Furthermore, the base 3 includes a radiator 22 made of Cu or the like, and a metal film 10. On the surface of the radiator 22, the metal film 10 composed of a Ni-plating (thickness: 2 μm) covered with an Au layer (thickness: 0.2 μm) is formed.

Even in a semiconductor device other than a semiconductor laser device, the sub-mount and the base have a function of radiating heat of the semiconductor element. For example, in the case where the semiconductor device is a GaAs electronic device, AlN, $Al_2O_3$, or the like is used for the sub-mount.

Figure 2:
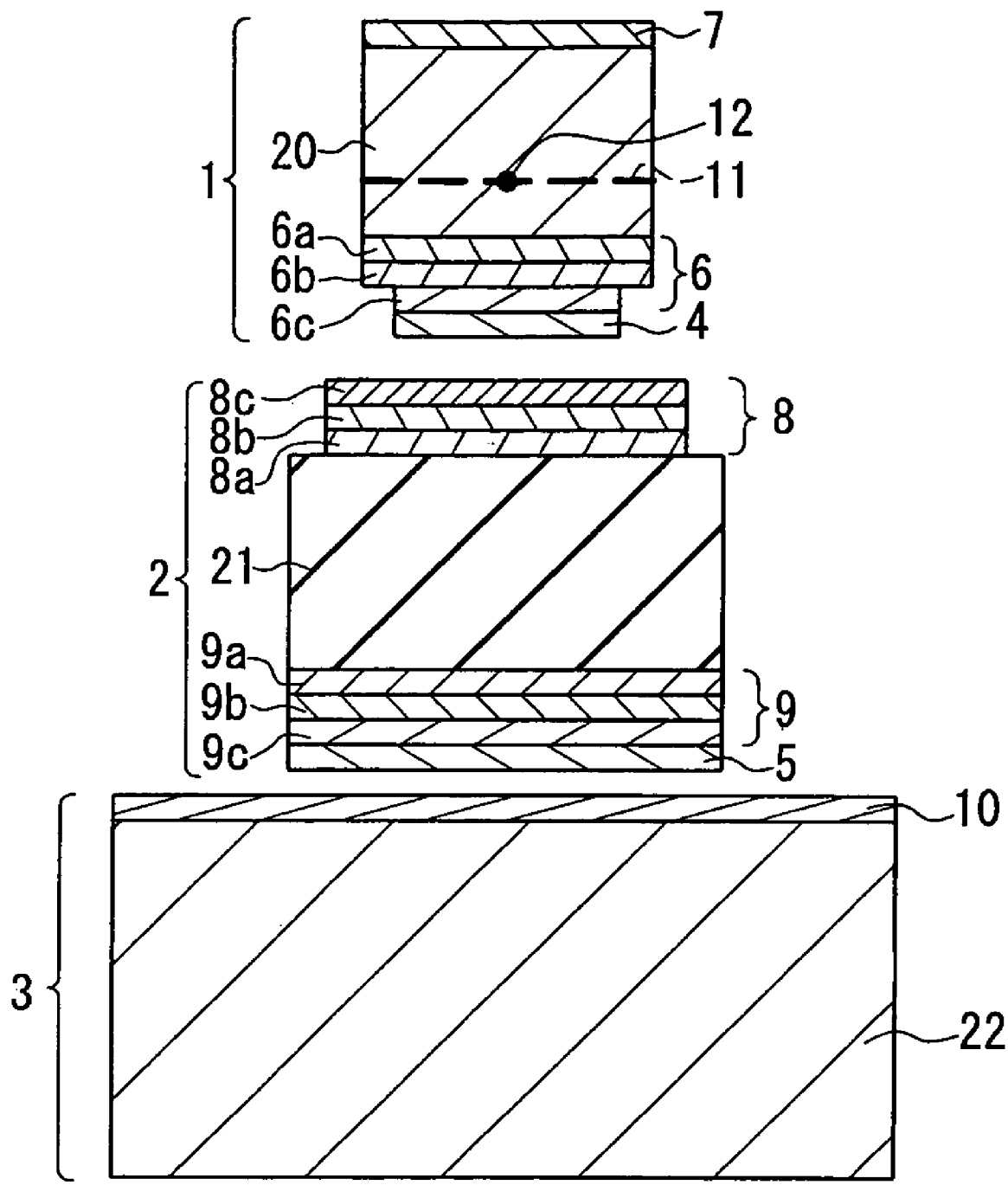
FIG. 2 is a side cross-sectional view showing a stack configuration of components of the semiconductor laser device according to Embodiment 1 of the present invention.

Hereinafter, the procedure of forming the solder layer 4 of an AuSn alloy in Embodiment 1 will be described with reference to FIG. 2. Over the entire surface of the semiconductor layered body 20 in which the semiconductor layer including the active layer 11 is formed, the Cr layer 6a, the Pt layer 6b, and the Au layer 6c are formed successively to predetermined thicknesses by EB vapor deposition. Thereafter, the resultant stack is coated with a resist and exposed to light through a mask to form an opening pattern. Herein, the opening shape of the resist pattern is not limited, and may be set to be a rectangle, an island shape, a comb shape, or the like, if required.

Next, the solder layer 4 made of an AuSn alloy is formed to a thickness of 3 μm on the surface of the surface electrode 6 with the resist opening pattern formed thereon, by a three-point jet wafer plating apparatus.

Thereafter, the resist pattern is removed, and the stack is etched with an etchant of a mixture containing iodine and water. For example, an etchant in which iodine and water are mixed in a ratio of 1:1 may be used. Consequently, a portion of the Au layer 6c that is not covered with the solder layer 4 is removed, and the Pt layer 6b is exposed to the surface.

On the other hand, a portion of the Au layer 6c covered with the solder layer 4 remains as it is, and the solder layer 4 is not modified with the etchant. According to the above method, the surface electrode 6 and the solder layer 4 are formed.

As a plating liquid used for forming the solder layer 4 containing an AuSn alloy, for example, a sulfite complex free of cyan, containing sodium sulfite as a complexing agent of Au, is used. The solder layer 4 can be formed under the plating conditions of a flow rate of a plating liquid of 15 L/min., a current density of 0.4 A/dm$^2$, a plating bath temperature of 35° C., and pH of 9.0. The plating bath temperature and pH are determined in view of the influence on a resist film. The plating conditions are not limited to the above.

The content of Sn of the solder layer 4 produced under the above plating conditions is 21 wt % (i.e., Au(79 wt %)-Sn (21 wt %)). Furthermore, a film-formation rate is 10 μm/hour. Furthermore, the solder layer 4 is very smooth and dense, and exhibited a dark green specular gloss. Furthermore, it is confirmed by evaluation with X-ray diffraction that the solder layer 4 is made of a mixture only of AuSn and $Au_5Sn$. Furthermore, the solder layer 4 thus obtained is melted immediately in the vicinity of 280° C., and excellent meltability is obtained. Furthermore, even after melting, only AuSn and $Au_5Sn$ are detected, and peaks of elemental Au and elemental Sn are not observed. Thus, it is confirmed that a stable AuSn alloy without segregation of Sn and the like is formed.

In order to enhance the wettability of the solder layer 4, a layer of Ni or the like may be provided on a lower surface of the solder layer 4. In this case, due to the interdiffusion of Ni and Sn, an Au—Sn—Ni alloy layer is formed.

As described above, since the composition of an alloy in the solder layer 4 is previously controlled in the plating process, the bonding temperature between the semiconductor laser element 1 and the sub-mount 2 can be stabilized to be low.

Furthermore, in Embodiment 1, the solder layer 4 may be formed of an AgSn alloy, in place of an AuSn alloy. By using the AgSn alloy, the mounting temperature can be lowered compared with the case of using the AuSn alloy, and the strain to be applied to the semiconductor laser element 1 in the course of mounting can be decreased further. Therefore, the reliability of the semiconductor laser element 1 can be enhanced further.

In the case of plating an AgSn alloy, in the same way as in the case of an AuSn alloy, an AgSn alloy plating layer is formed to a thickness of 3 μm on the surface of the surface electrode 6 with a resist opening pattern formed thereon by a three-point jet wafer plating apparatus.

As the plating liquid used for forming the solder layer 4 containing an AgSn alloy, a sulfite complex free of cyan containing sodium sulfite as a complexing agent of Au is used. An AgSn alloy plating layer can be formed, for example, under the plating conditions of a flow rate of a plating liquid of 10 L/min., a current density of 3 A/dm$^2$, a plating bath temperature of 25° C., and pH of 9.0. The plating bath temperature and pH are determined in view of the influence on a resist film. The plating conditions are not limited to the above.

The content of Sn of the solder layer 4 produced under the above plating conditions is 96 wt % (i.e., Ag(4 wt %)-Sn(96 wt %)). Furthermore, the film-formation rate is 10 μm/hour. In the solder layer 4 containing Ag and Sn, the content of Sn with respect to the total amount of Ag desirably is in the vicinity of 95 wt %. In such a case, a remarkable decrease in melting point of the solder layer 4 is observed.

In Embodiment 1, AuSn or AgSn is used as an alloy solder plating material of the solder layers 4 and 5. However, as long as an alloy solder plating material having its composition previously controlled is used, the similar effects can be obtained. For example, an alloy solder plating material such as PbSn, InSn, AuGe, AuSi, and the like may be used.

Figure 3:
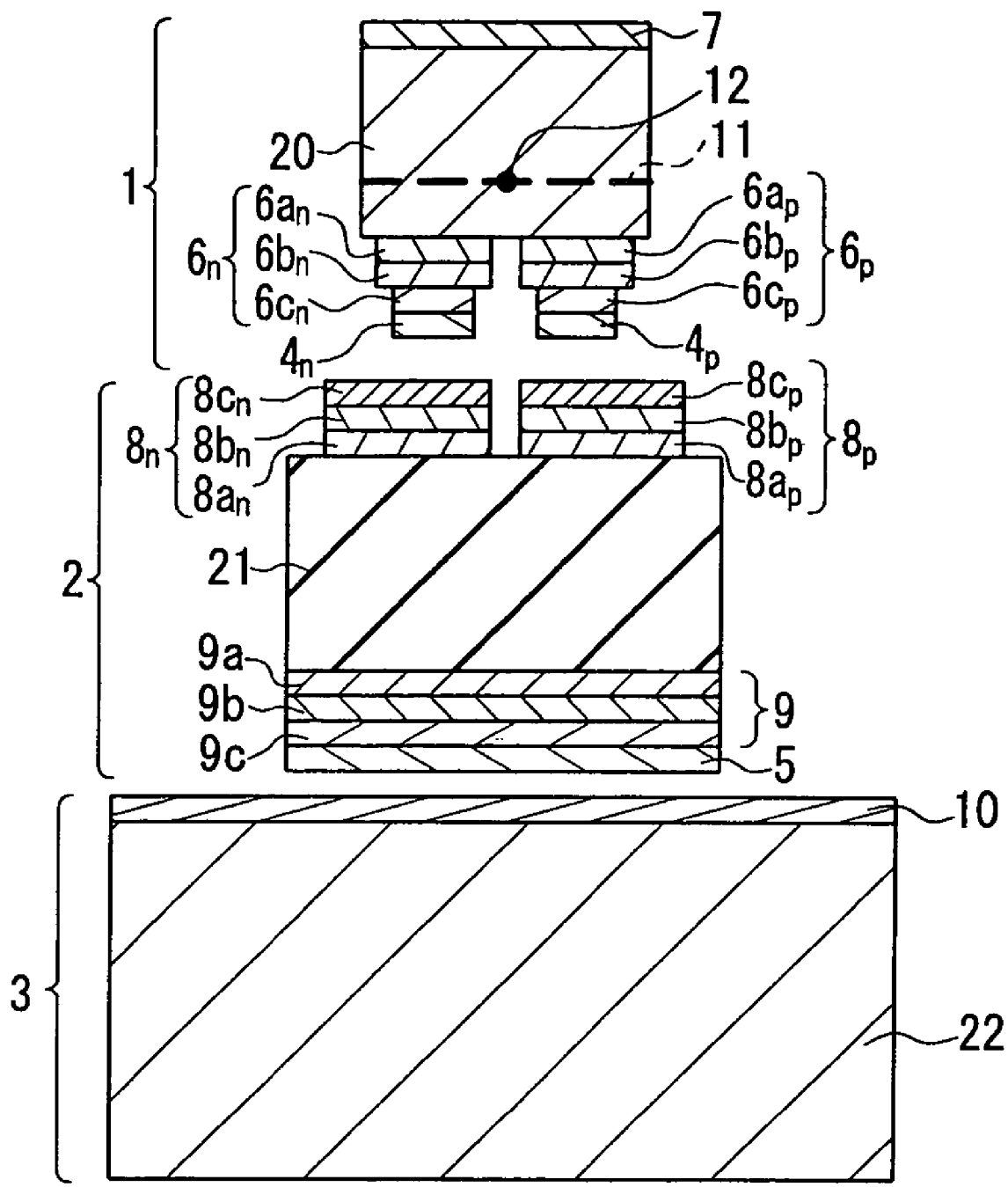
FIG. 3 is a side cross-sectional view showing a stack configuration of components of another semiconductor laser device according to Embodiment 1 of the present invention.

FIG. 3 is a side cross-sectional view showing a stack configuration of each component of another semiconductor laser device according to Embodiment 1. The semiconductor laser device shown in FIG. 3 is different from the semiconductor laser device shown in FIG. 2, in that a GaN blue semiconductor laser with a resonator length of 600 μm, a chip width of 500 μm, and a thickness of 100 μm is used as the semiconductor laser element 1. In FIG. 3, the surface electrode is divided into two: a p-type electrode $6_p$ and an n-type electrode $6_n$. Solder layers $4_p$ and $4_n$ are formed on the respective electrodes. On the surface side of the semiconductor layered body 20, Cr layers $6a_p$, $6a_n$ (thickness: 0.05 μm), Pt layers $6b_p$, $6b_n$ (thickness: 0.1 μm), Au layers $6c_p$, $6c_n$ (thickness: 0.05 μm), and solder layers $4_p$, $4_n$ (thickness: 3 μm) made of an AuSn alloy are formed. The interval between the p-type electrode $6_p$ and the n-type electrode $6_n$ is 175 μm.

Furthermore, the surface electrode formed on the semiconductor laser element 1 side of the sub-mount 2 also is divided into two: a p-type electrode $8_p$ and an n-type electrode $8_n$. On the surface side of the electrical insulating material 21, Ti layers $8a_p$, $8a_n$ (thickness: 0.1 μm), Pt layers $8b_p$, $8b_n$ (thickness: 0.2 μm), and Au layers $8c_p$, $8c_n$ (thickness: 0.05 μm) are formed in this order. Thus, even if the surface electrode is divided into two, i.e., the p-type electrode $6_p$ and the n-type electrode $6_n$, since the solder layers $4_p$ and $4_n$ are formed so as to have a thickness in a range of 1 μm to 10 μm as described above, the solder layers $4_p$ and $4_n$ spread less even after bonding of the semiconductor laser element 1 and the sub-mount 2, and a short-circuit defect does not occur between the p-type electrode $6_p$ and the n-type electrode $6_n$.

Embodiment 2

A semiconductor laser device and a method for producing the same according to Embodiment 2 of the present invention will be described.

The semiconductor laser device of Embodiment 2 is the same as that of Embodiment 1, except that an Au-rich layer further is provided on the surface of the solder layer 4.

The semiconductor laser device of Embodiment 2 is processed so that the solder layer 4 can be recognized easily. The surface of the solder layer 4 containing an AuSn alloy formed by the method described in Embodiment 1 has dark green gloss, and is not modified with an etchant. Therefore, the surface of the solder layer 4 has no difference in flatness compared with the Pt layer 6b that is a surface layer in another region. Therefore, when a plurality of semiconductor laser elements are formed as a single unit, and is divided into individual semiconductor laser elements (cleavage step) in the course of production of the semiconductor laser elements, an electrode pattern cannot be recognized. In order to facilitate pattern recognition between the solder layer 4 and the surface of the Pt layer 6b, it is preferable to provide a difference in flatness between the solder layer 4 and the Pt layer 6b.

Hereinafter, a conventional general method for controlling the flatness of a plating surface will be described. The gloss of a plating surface depends upon the size of particles of the plating crystal. Therefore, when the pulverization of plating crystal is promoted to an optically sufficient degree, the flatness of a surface of the crystal becomes high, and a surface with small random reflection of light is obtained. Furthermore, the pulverization of plating crystal is achieved when the number of metal ions reaching an electrode is large. In order to increase the number of metal ions reaching an electrode, it is necessary only to increase a current density in a plating bath. For example, a current flowing through an electrode may be increased, the concentration of metal ions in a plating bath may be increased, and the like. Furthermore, even by adding an organic ion with high adsorptivity to a plating liquid, the ability of the metal ions to reach an electrode can be promoted. Furthermore, by using an adder having a crystal adjustment effect for the plating crystal, semigloss smooth crystal of an AuSn alloy having a small particle size can be obtained.

As described above, by adjusting so that the current density is decreased in a plating bath, and the amount of an adder in a plating liquid is reduced, thereby increasing the particle size of plating crystal, unevenness can be formed on the surface of the solder layer containing an AuSn alloy.

A solder layer having a composition of Au(79 wt %)-Sn (21 wt %) can be obtained by using the above-mentioned method. Furthermore, the unevenness of the surface can be increased, and the flatness of the solder layer with respect to the peripheral Pt layer can be lowered. As a result, pattern recognition can be performed without any trouble in the above-mentioned cleavage step and the subsequent steps such as mounting of the semiconductor laser element 1.

However, the solder layer containing an AuSn alloy of the semiconductor laser device of Embodiment 1 is melted stably at 280° C., whereas the solder layer obtained by the above method cannot be melted unless the temperature is raised to 340° C., irrespective of the same composition, and the wettability also is low. This is considered to be caused by the variation in a particle size of plating crystal in an AuSn alloy. That is, when the unevenness of the surface of the plating layer of an AuSn alloy is increased by the method of decreasing the number of metal ions reaching an electrode, a solder layer having a low melting point cannot be formed.

Figure 4:
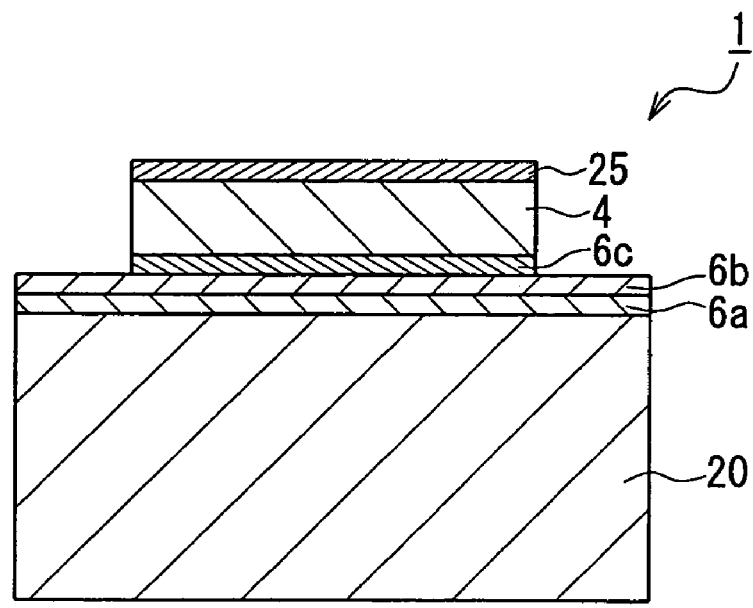
FIG. 4 is a side cross-sectional view showing a stack configuration of a semiconductor laser element according to Embodiment 2 of the present invention.
Figure 5:
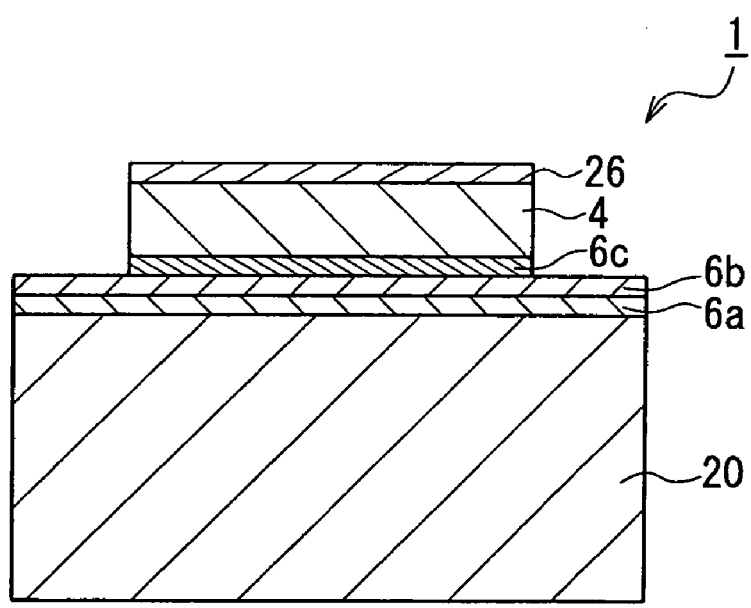
FIG. 5 is a side cross-sectional view showing a stack configuration of another semiconductor laser element according to Embodiment 2 of the present invention.

The inventors provided the difference in flatness between the uppermost surface of the solder layer 4 containing an AuSn alloy, and the Pt layer 6b by the following method. FIGS. 4 and 5 show examples of side cross-sectional views of a solder layer of a semiconductor laser device according to Embodiment 2.

The configuration shown in FIG. 4 is formed by the following method. A semiconductor layered body 20 with a resist pattern film formed thereon is produced by the same method as that of Embodiment 1. Thereafter, a solder layer 4 containing an AuSn alloy is formed to a thickness of 2.8 μm, using a three-point jet wafer plating apparatus. Thereafter, while the semiconductor layered body 20 is soaked, for example, the current density that has been 0.4 A/dm$^2$ is decreased to about 0.1 A/dm$^2$. As a result, an Au-rich layer 25 (thickness: 0.2 μm) is formed on the solder layer 4 containing an AuSn alloy. The Au-rich layer 25 contains Au in an amount of at least 80 wt % or more. The Au-rich layer 25 has a light gold gloss on its surface. The Au-rich layer 25 has a composition of Au(97 wt %)-Sn(3 wt %) with the content of Sn being 3 wt %. Thus, the composition mainly containing Au is obtained.

Thereafter, the resist pattern film is removed, and the resultant stack is etched with an etchant of a mixture containing iodine and water. For example, an etchant in which iodine and water are mixed in a ratio of 1:1 may be used. At this time, an Au layer 6c formed by EB vapor deposition is removed partially, and a portion with a thickness of about 0.1 μm is etched from the surface of the Au-rich layer 25. Thus, the Au-rich layer 25 having a thickness of 0.1 μm remains, and unevenness is formed on the surface thereof.

A Cr layer 6a and a Pt layer 6b are formed over the entire surface of the layered body 20. On the Pt layer 6b, the Au layer 6c and the solder layer 4 are patterned in the same shape, and the Au-rich layer 25 with unevenness is formed on the uppermost surface. Since the Au-rich layer 25 has unevenness, the Au-rich layer 25 has lower flatness compared with the peripheral Pt layer 6b. Thus, pattern recognition can be performed easily in a primary cleavage step, a mounting step for the semiconductor laser element 1, and the like.

When the content of Sn of the Au-rich layer 25 is 10 wt % (i.e., the content exceeds Au(90 wt %)-Sn(10 wt %)), even if the Au-rich layer 25 is etched with an etchant, sufficient unevenness cannot be formed on the surface, which makes it difficult to obtain a required pattern recognition ratio. Thus, the content of Au in the Au-rich layer 25 preferably is 90 wt % or more.

Furthermore, the solder layer 4 has a composition of Au(79 wt %)-Sn(21 wt %), and the entire composition including the Au-rich layer 25 is controlled. Therefore, the solder layer 4 is melted at 280° C. stably in the same way as in the case where the Au-rich layer 25 is not formed. The reason for this is considered as follows. The solder layer 4 with the Au-rich layer 25 formed thereon is made of plating crystal having a small particle size formed uniformly in the same way as in Embodiment 1, so that variation of melting does not occur.

Furthermore, by changing plating conditions in the course of the same plating production, a plating layer having an excellent composition and processability can be obtained. Plating conditions can be changed by changing a plating current value.

For preventing oxidation, the thickness of the Au-rich layer 25 whose surface is roughened by etching preferably is at least 0.02 μm. With a thickness smaller than this, the Au-rich layer 25 is formed in an island shape, which may not play a role of preventing oxidation.

Furthermore, it is preferable that the content of Au in the Au-rich layer 25 is higher for the following reason. As the content of Au is higher, more sufficient unevenness can be formed on the surface. An Au-plating layer 26 made of only Au may be used in place of the Au-rich layer 25. In this case, it is desirable that the stack is soaked in an Au-plating device, instead of performing vapor deposition or the like. That is, as shown in FIG. 5, the solder layer 4 containing an AuSn alloy having a single composition is formed, and then, the Au-plating layer 26 made of only Au may be formed with an Au-plating liquid containing only Au. The reason for this is as follows. Both the solder layer 4 and the Au-plating layer 26 can be formed while the same resist film is formed.

Furthermore, in the case of forming the Au-plating layer 26 by vapor deposition, it is necessary that the resist film covered with the Au layer is removed later by the method such as lift-off. Furthermore, even in the layers obtained by the method of the present embodiment, the same meltability and pattern recognition as those in the case of forming the Au-rich layer 25 shown in FIG. 4 are obtained.

Thus, by providing the Au-rich layer or the Au-plating layer 26 on the uppermost surface, the environmental resistance of the solder layer 4 containing an AuSn alloy including Sn that is likely to be oxidized can be enhanced. In addition, even with the elapse of time after forming plating, meltability similar to that in the case of melting immediately after forming plating can be obtained.

The case where the solder layer 4 contains an AuSn alloy has been described. Hereinafter, the case where the solder layer 4 contains an AgSn alloy will be described. In the case where the solder layer 4 contains an AgSn alloy, since Ag and Sn are both likely to be oxidized, a particularly large oxidation preventing effect is obtained by providing the Au-rich layer 25 on the uppermost surface of the solder layer 4. Therefore, even with the elapse of time after forming the solder layer 4, meltability similar to that in the case of melting immediately after forming plating can be obtained, and variation in adhesion strength can be reduced.

Furthermore, the Au-rich layer 25 on the uppermost surface preferably is etched with an etchant of a mixture containing iodine and water to be provided with unevenness, in the same way as in the case of the solder layer 4 made of an AgSn alloy. Consequently, compared with the peripheral Pt layer 6b, the Au-rich layer 25 has lower flatness, and pattern recognition can be performed easily during a primary cleavage step, a mounting step of the semiconductor laser element 1, and the like.

In the case of etching the Au-rich layer 25, when the content of Au in the Au-rich layer 25 is smaller than 90 wt %, sufficient unevenness cannot be formed on the surface, which makes it difficult to obtain a required pattern recognition ratio. Therefore, the content of Au in the Au-rich layer 25 desirably is 90 wt % or more.

Furthermore, in order to prevent the solder layer 4 containing an AgSn alloy from being oxidized, the thickness of the Au-rich layer 25 whose surface is roughened by etching desirably is at least 0.02 μm. With the thickness smaller than this, the Au-rich layer 25 is formed in an island shape, which may not play a role of preventing oxidation.

Furthermore, it is preferable that the content of Au in the Au-rich layer 25 is higher since more sufficient unevenness can be formed on the surface. The Au-plating layer 26 made of only Au may be used in place of the Au-rich layer 25, in the same way as in the solder layer 4 made of an AuSn alloy. In this case, the Au-plating layer 26 desirably is formed by vapor deposition or by being soaked in an Au-plating apparatus.

In Embodiment 2, although an AuSn alloy and an AgSn alloy are used as an alloy solder plating material of the solder layers 4, the same effects can be obtained as long as an alloy plating material with a composition previously controlled is used. For example, an alloy solder material such as AuGe and AuSi may be used.

Embodiment 3

In Embodiment 3, a method for producing a semiconductor laser device according to Embodiment 1 or 2 will be described with reference to the drawings. Herein, although exemplary production of a semiconductor device with a semiconductor laser element mounted on a sub-mount will be described, the present invention is not limited thereto. The present invention also is applicable to a method for producing a semiconductor device with a configuration in which another semiconductor element is mounted on a sub-mount.

Figure 6:
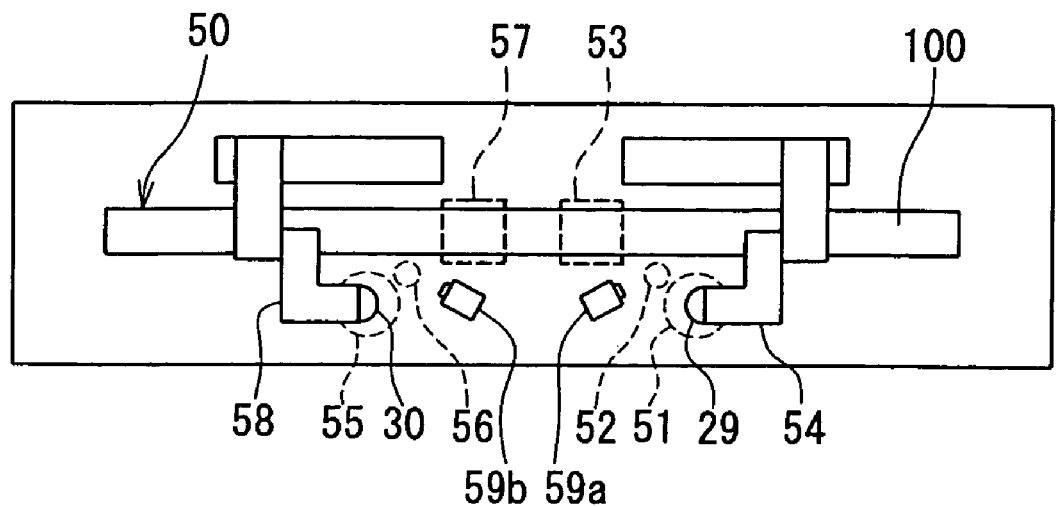
FIG. 6 is a plan view showing a configuration of a semiconductor laser device assembly apparatus according to Embodiment 3 of the present invention.
Figure 7:
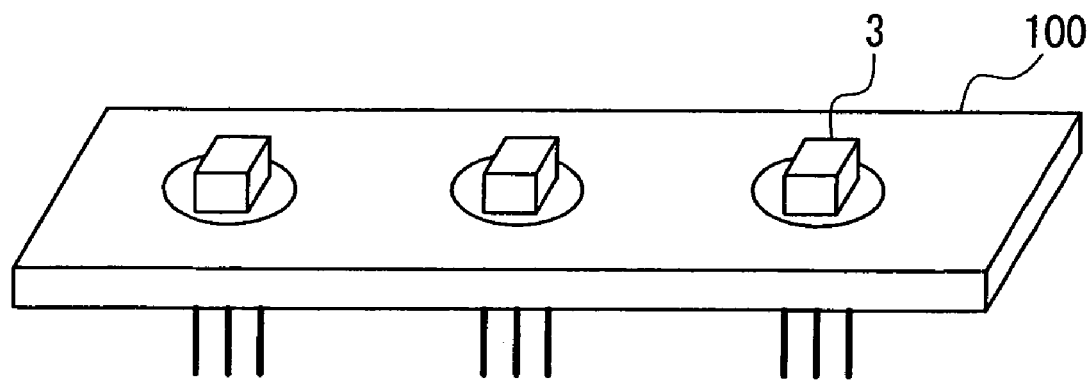
FIG. 7 is an enlarged perspective view of a tape of the semiconductor laser device assembly apparatus according to Embodiment 3 of the present invention.

FIG. 6 is a plan view showing a configuration of a semiconductor laser device assembly apparatus in Embodiment 3. FIG. 7 is an enlarged perspective view of a tape of the semiconductor laser device assembly apparatus. A metallic tape 100 moves on a tape transportation line 50. The tape 100 moves from right to left in FIG. 6. On the tape 100, a plurality of bases 3 are placed, as shown in FIG. 7, and each base 3 is transported by the movement of the tape 100.

A sub-mount adsorbing collet 29 is provided at the end of a sub-mount transfer arm 54. The sub-mount transfer arm 54 is mobile, and the sub-mount adsorbing collet 29 can move to a sub-mount bonding position 53, a sub-mount recognizing position 52, and a sub-mount supply position 51. Furthermore, a laser element adsorbing collet 30 is provided at the end of a laser element transfer arm 58. The laser element transfer arm 58 is mobile, and the laser element adsorbing collet 30 can move to a laser element bonding position 57, a laser element recognizing position 56, and a laser element supply position 55 on the tape 100. Furthermore, cameras 59a and 59b for recognizing the directions of the sub-mount 2 and the semiconductor laser element 1 are provided.

Furthermore, at the sub-mount bonding position 53 and the laser element bonding position 57, heating mechanisms for melting a solder layer made of plating are placed.

A procedure of assembling a semiconductor laser device by the semiconductor laser device assembly apparatus will be described with reference to FIGS. 8A to 8F. FIGS. 8A to 8F respectively are plan views illustrating an assembly step of a semiconductor laser device by the semiconductor laser device assembly apparatus.

Figure 8A:
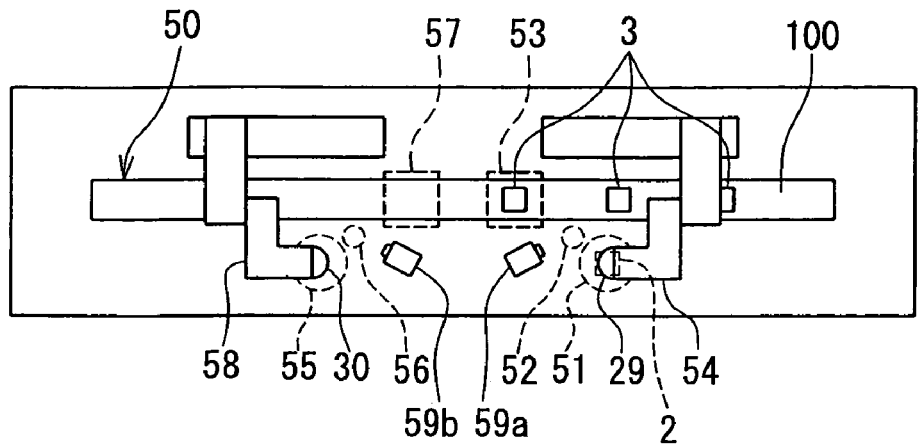
FIG. 8A is a view showing an assembly step for the semiconductor laser device assembly apparatus according to Embodiment 3 of the present invention.

As shown in FIG. 8A, when a leading base 3 reaches the sub-mount bonding position 53, the sub-mount adsorbing collet 29 moves to the sub-mount supply position 51 and picks up a sub-mount 2. The sub-mount adsorbing collet 29 moves by the movement of the sub-mount transfer arm 54.

Figure 8B:
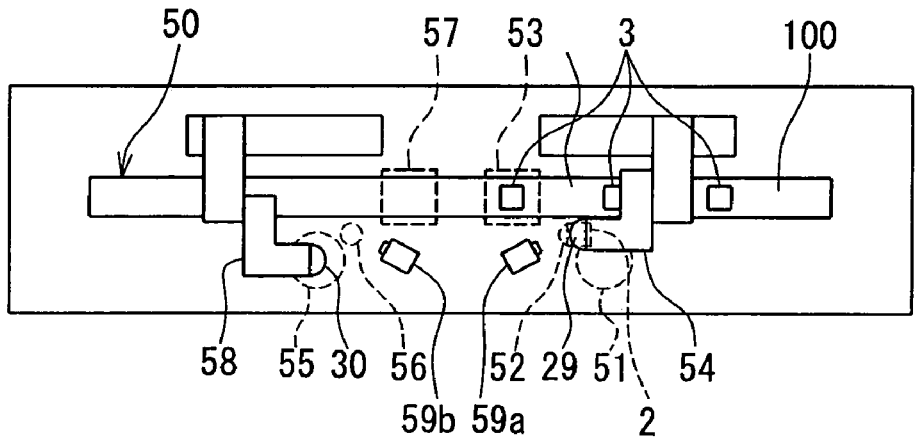
FIG. 8B is a view showing an assembly step for the semiconductor laser device assembly apparatus according to Embodiment 3 of the present invention.

As shown in FIG. 8B, the sub-mount adsorbing collet 29 moves to the sub-mount recognizing position 52 while holding the sub-mount 2. At the sub-mount recognizing position 52, the direction of the sub-mount 2 held by the sub-mount adsorbing collet 29 is recognized by a camera 59a with a CCD, an image sensor, or the like mounted thereon.

Figure 8C:
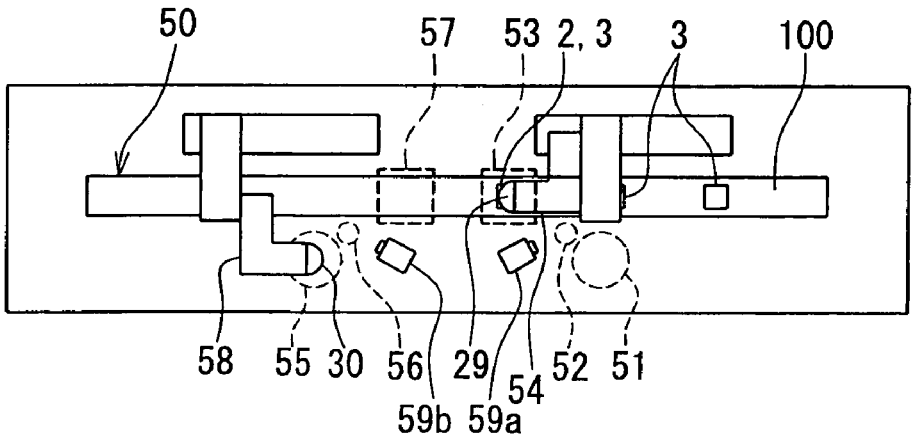
FIG. 8C is a view showing an assembly step for the semiconductor laser device assembly apparatus according to Embodiment 3 of the present invention.

The sub-mount adsorbing collet 29 moves to the sub-mount bonding position 53 while holding the sub-mount 2, as shown in FIG. 8C, and places the sub-mount 2 at a predetermined position on the base 3 having reached the sub-mount bonding position 53. In the sub-mount adsorbing collet 29, the sub-mount 2 is supplied with a load of 15 g in the direction of the base 3 (downward direction). In this state, the sub-mount and the base 3 are heated to 310° C. by the heating mechanism placed at the sub-mount bonding position 53. As a result, the solder layer 5 of the sub-mount 2 and the Au-plating layer 10 covering the surface of the base 3 are melted to react with reach other, whereby the sub-mount 2 is bonded to the base 3. At this time, on the sub-mount adsorbing collet 29 side of the sub-mount 2, a surface electrode 8 is placed with no plating layer formed thereon. Therefore, the sub-mount adsorbing collet 29 side is not deformed by heating, and no mark of the sub-mount adsorbing collet 29 is formed. The bonding temperature of the base 3 and the sub-mount 2 is set to be 310° C. However, even if the bonding temperature of the sub-mount 2 is higher than this, there is no influence on the reliability of the semiconductor laser element 1. Therefore, there is no particular constraint to the material, composition, and bonding temperature of a plating layer.

When the first base 3 is bonded to the sub-mount 2, the tape 100 is fed forward by one pitch, and the second base 3 reaches the sub-mount bonding position 53. Thus, the above-mentioned operation is repeated.

Figure 8D:
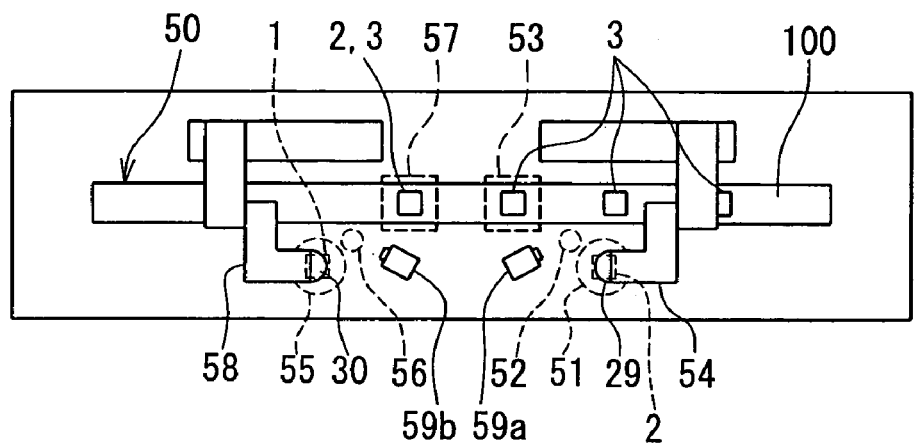
FIG. 8D is a view showing an assembly step for the semiconductor laser device assembly apparatus according to Embodiment 3 of the present invention.

As shown in FIG. 8D, when the base 3 with the sub-mount 2 bonded thereto reaches the laser element bonding position 57, the laser element adsorbing collet 30 moves to the laser element supply position 55, and picks up the semiconductor laser element 1. The laser element adsorbing collet 30 moves by the movement of the laser element transfer arm 58.

Figure 8E:
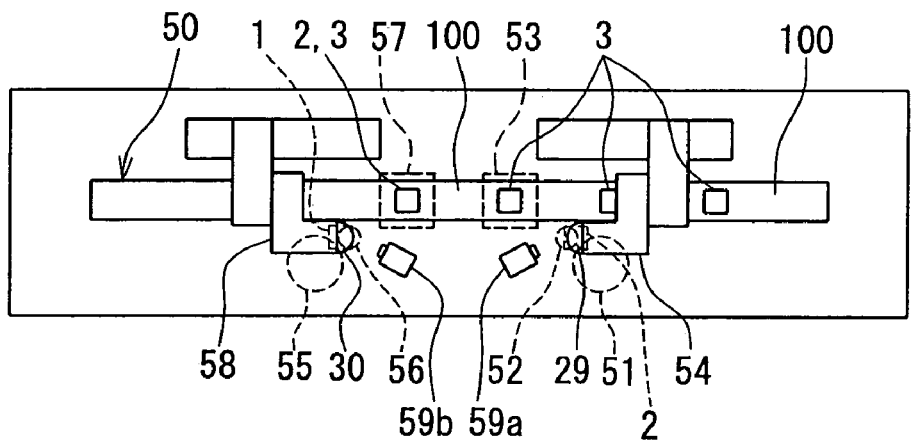
FIG. 8E is a view showing an assembly step for the semiconductor laser device assembly apparatus according to Embodiment 3 of the present invention.

The laser element adsorbing collet 30 holding the semiconductor laser element 1 moves to the laser element recognizing position 56, as shown in FIG. 8E. At the laser element recognizing position 56, the direction of the semiconductor laser element 1 held by the laser element adsorbing collet 30 is recognized by a camera 59b with a CCD, an image sensor, or the like mounted thereon.

Figure 8F:
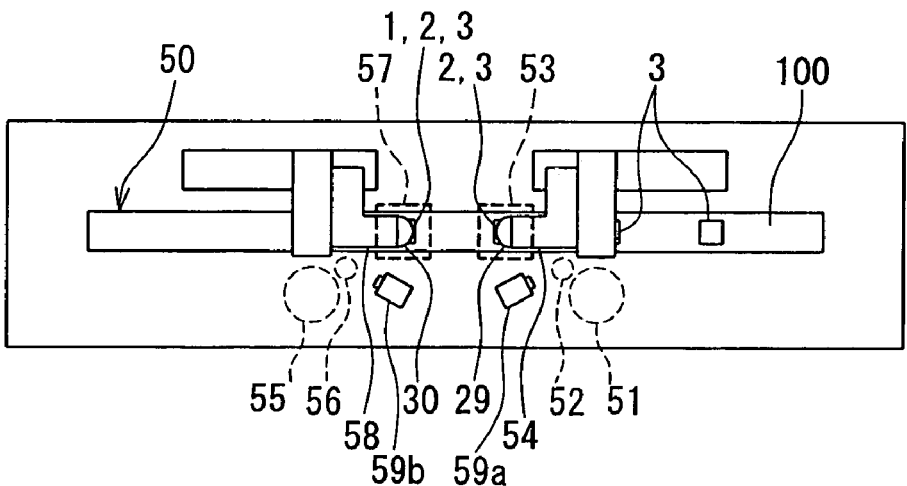
FIG. 8F is a view showing an assembly step for the semiconductor laser device assembly apparatus according to Embodiment 3 of the present invention.
Figure 9:
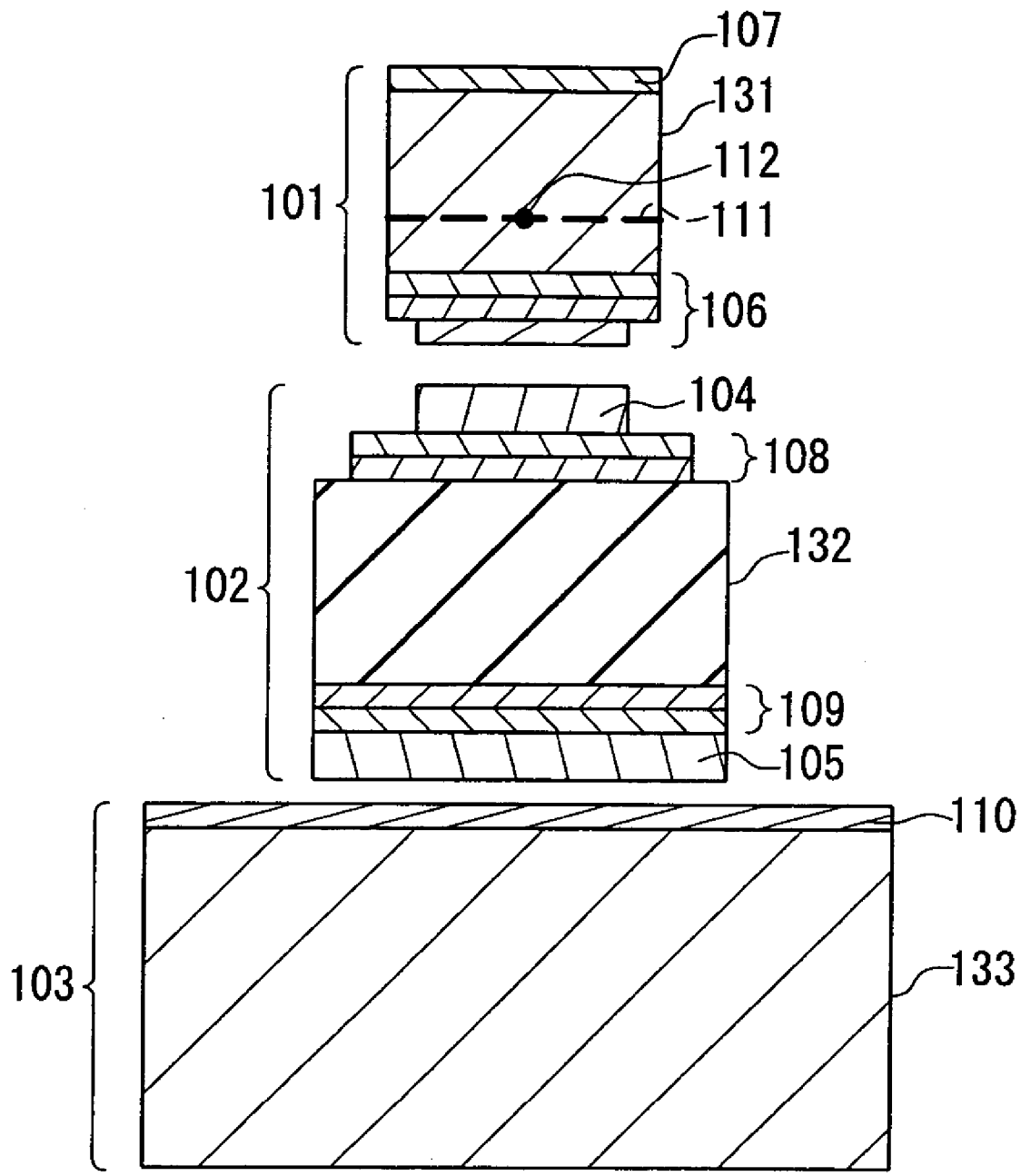
FIG. 9 is a side cross-sectional view showing a state before bonding a semiconductor laser element, a sub-mount, and a base to each other in a conventional semiconductor laser device.
Figure 10:
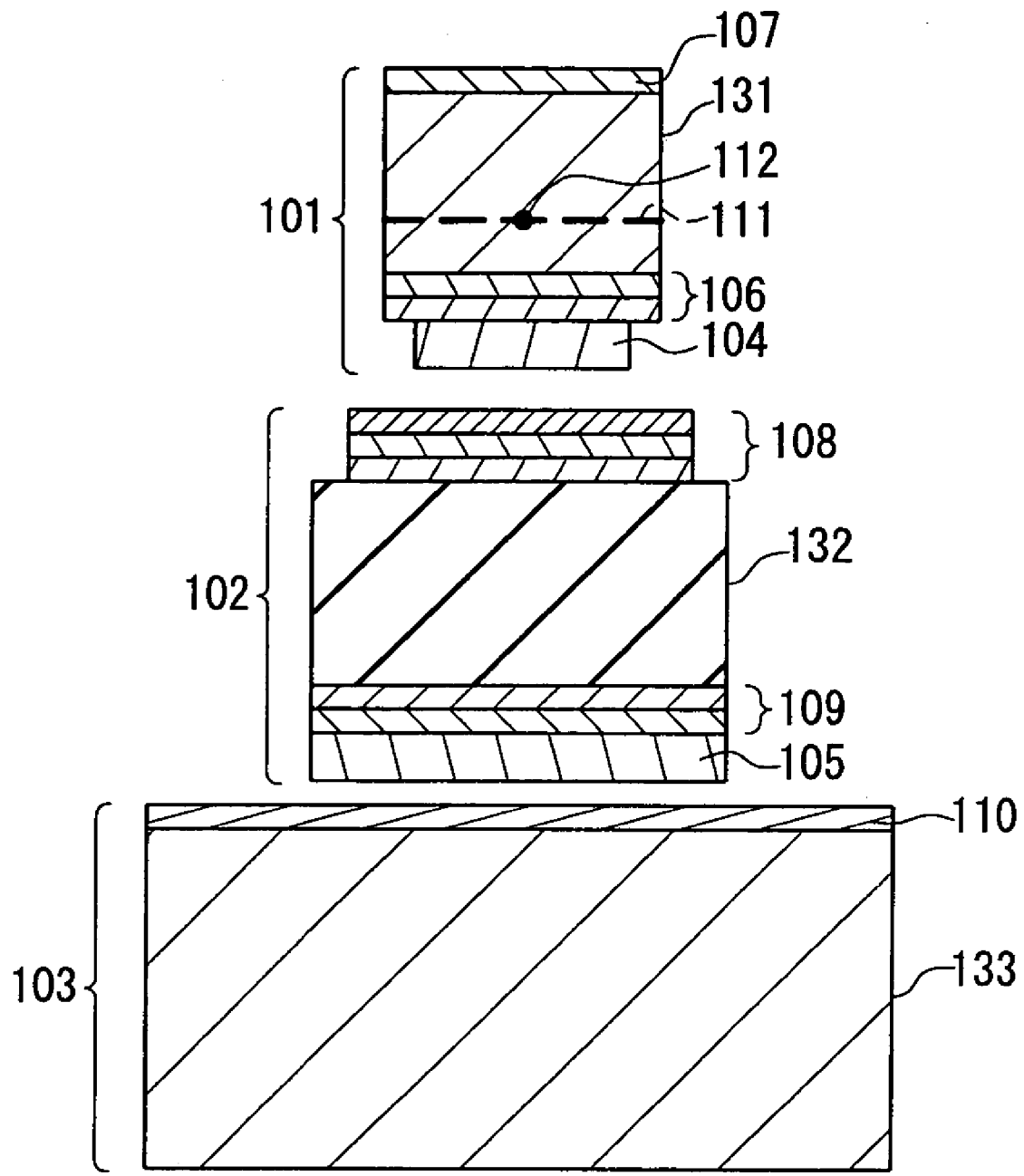
FIG. 10 is a side cross-sectional view showing a state before bonding a semiconductor laser element, a sub-mount, and a base to each other in another conventional semiconductor laser device.
Figure 11:
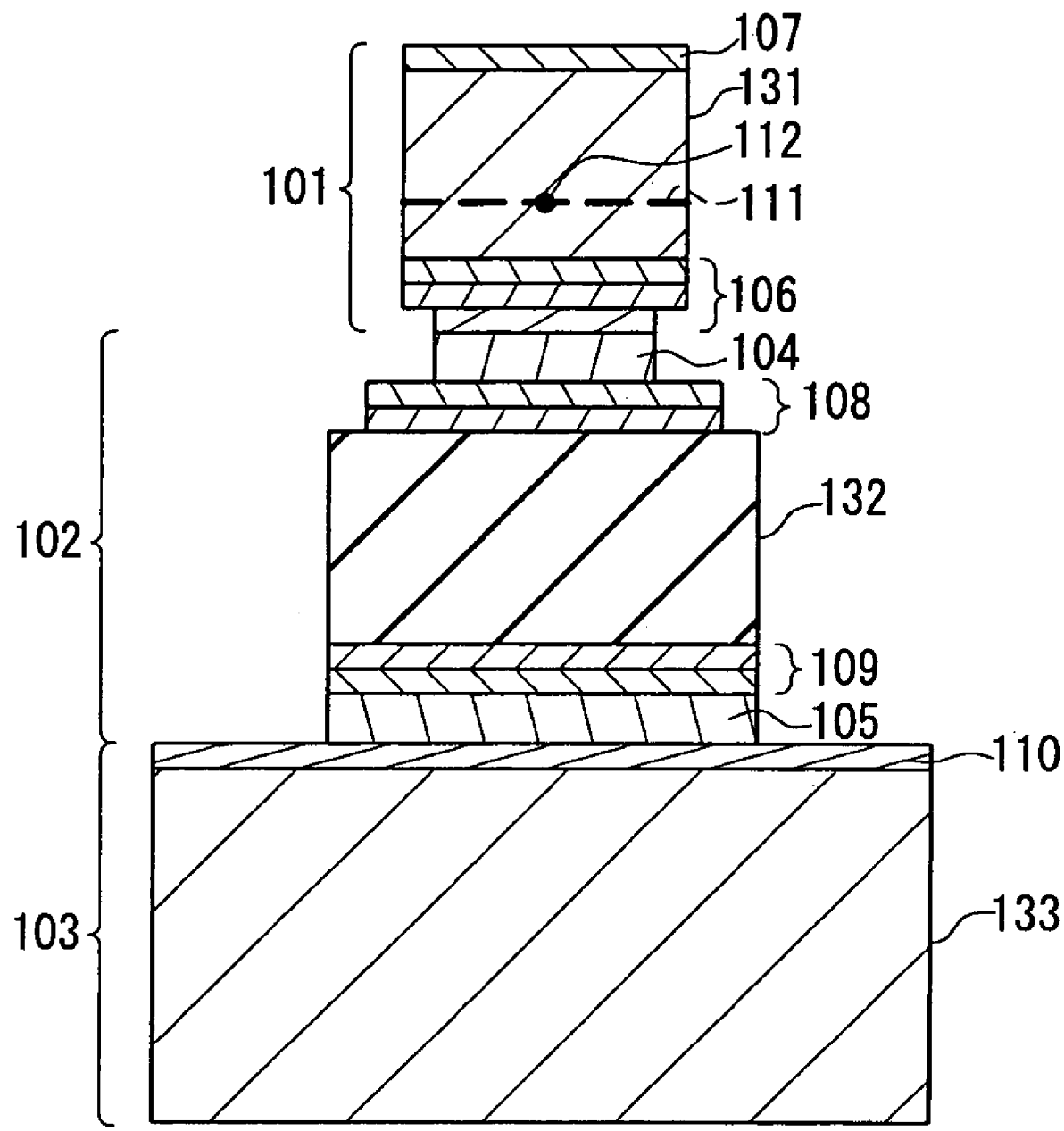
FIG. 11 is a side cross-sectional view showing a configuration of a conventional semiconductor laser device.

Furthermore, as shown in FIG. 8F, the laser element adsorbing collet 30 moves to the laser element bonding position 57 while holding the semiconductor laser element 1, and places the semiconductor laser element 1 at a predetermined position on the sub-mount 2 having reached the laser element bonding position 57.

In the case where the semiconductor laser element 1 has an Au-rich layer 25 or an Au-plating layer 26 as described in Embodiment 2, the surface is rough, so that pattern recognition is made possible based on the different in light intensity. Thus, alignment and direction control can be performed without any trouble.

When the semiconductor laser element 1 is placed at a predetermined position of the sub-mount 2, the semiconductor laser element 1 is supplied with a load of 10 g in the direction of the sub-mount 2 (downward direction) in the laser element adsorbing collet 30. In this state, the sub-mount 2, the base 3, and the semiconductor laser element 1 are heated to 310° C. by the heating mechanism placed at the laser element bonding position 57. As a result, the solder layer 4 of the semiconductor laser element 1 is melted, and the Au-layer 8c of the sub-mount 2 and the solder layer 4 react with each other, whereby the sub-mount 2 is bonded to the semiconductor laser element 1. At this time, a reverse-surface electrode 7 of the semiconductor laser element 1 held by the laser element adsorbing collet 30 is not deformed by heating.

Furthermore, since the solder layer 4 is formed in the semiconductor laser element 1, even if the position of the semiconductor laser element 1 is shifted, the solder layer 4 does not come around the side face of the semiconductor laser element 1.

Furthermore, the solder layer 5 made of an AuSn alloy that bonds the base 3 to the sub-mount 2 contains Au in an amount larger than that of the solder layer 4 made of an AuSn alloy that bonds the semiconductor laser element 1 to the sub-mount 2, and has a high melting point. Therefore, the solder layer 5 is not melted again by heating in this case. When the base 3 is bonded to the sub-mount 2, Au is melted from the metal film 10 to the solder layer 5 to increase the melting point of the solder layer 5. Therefore, the solder layers 4 and 5 originally may have the same composition.

Thereafter, similarly, the bonding operation between the sub-mount 2 and the base 3, and the bonding operation between the semiconductor element 1 and the sub-mount 2 are performed in parallel successively, whereby a semiconductor laser device of Embodiment 1 or 2 is produced.

According to the above-mentioned production method, the sub-mount 2 and the semiconductor laser element 1 that are components to be placed on the base 3 can be exactly bonded to the base 3 separately, and unrequired melting of a plating layer does not occur. Furthermore, operations can be performed in parallel in one assembly apparatus. Therefore, a semiconductor laser device can be assembled with an exact positional precision at a stable temperature in a short period of time.

Figure 12C:
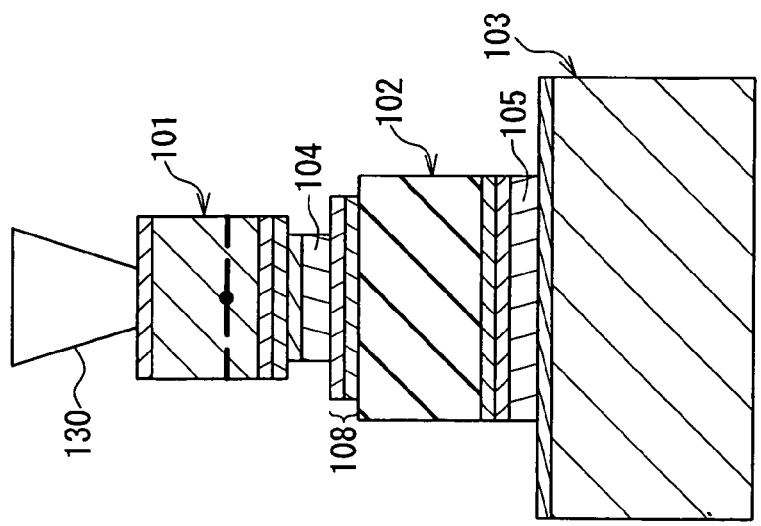
FIG. 12C is a view showing a mounting step for a semiconductor laser element in the case where a solder layer is formed on a sub-mount side.
Figure 12B:
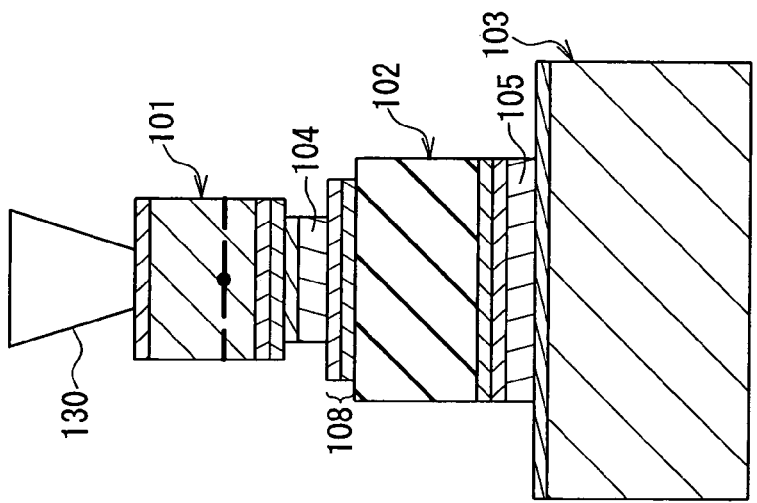
FIG. 12B is a view showing a mounting step for a semiconductor laser element in the case where a solder layer is formed on a sub-mount side.
Figure 12A:
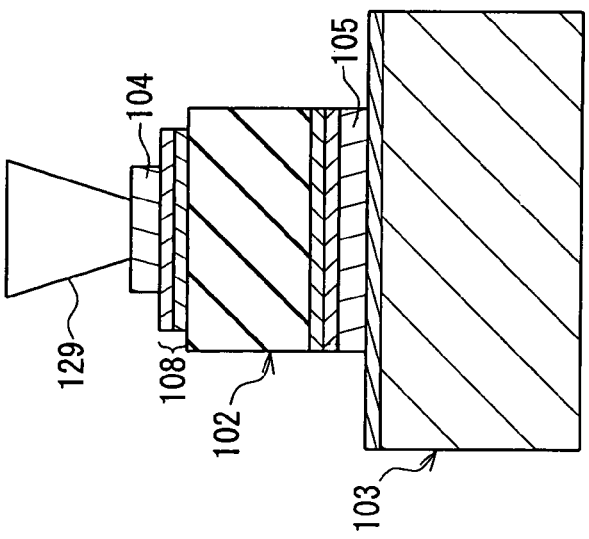
FIG. 12A is a view showing a mounting step for a semiconductor laser element in the case where a solder layer is formed on a sub-mount side.
Figure 13A:
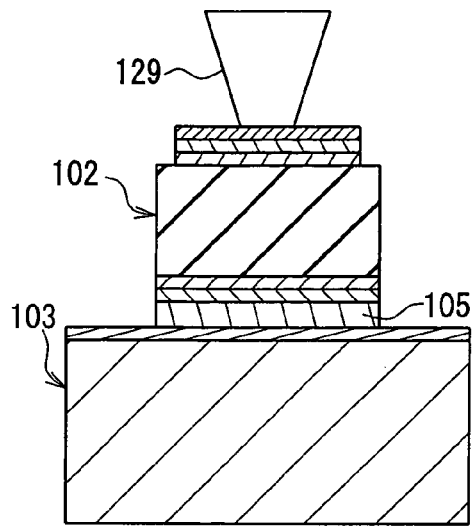
FIG. 13A is a view showing a mounting step for a semiconductor laser element in the case where a solder layer is formed on a semiconductor laser element side.
Figure 13B:
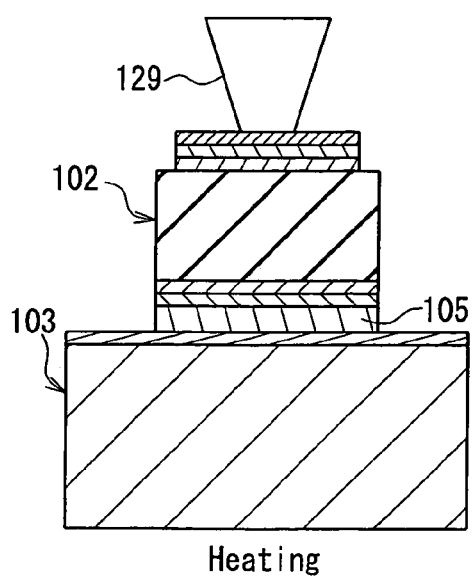
FIG. 13B is a view showing a mounting step for a semiconductor laser element in the case where a solder layer is formed on a semiconductor laser element side.
Figure 13C:
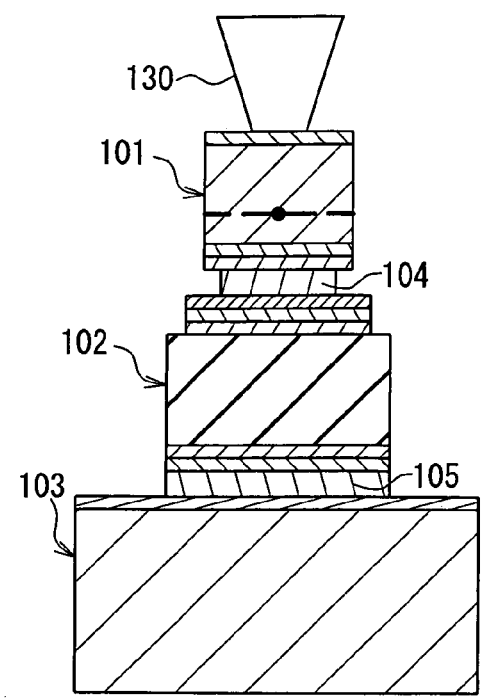
FIG. 13C is a view showing a mounting step for a semiconductor laser element in the case where a solder layer is formed on a semiconductor laser element side.
Figure 13D:
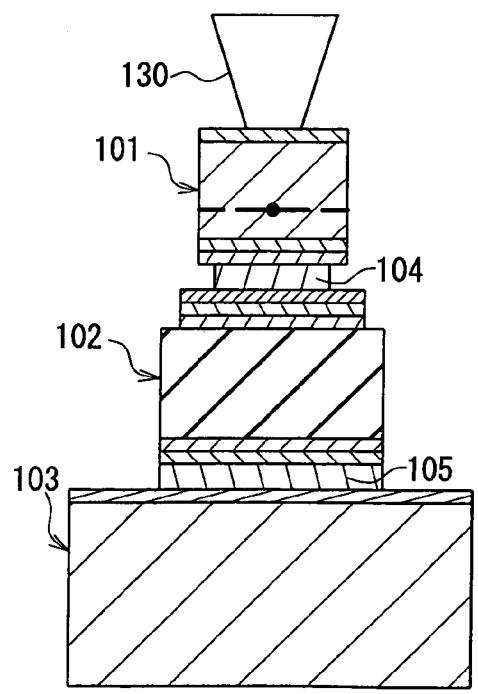
FIG. 13D is a view showing a mounting step for a semiconductor laser element in the case where a solder layer is formed on a semiconductor laser element side.
Figure 14A:
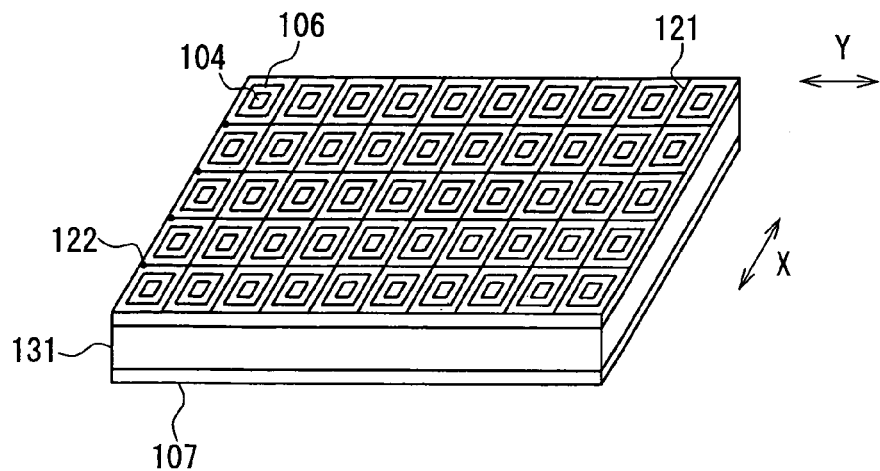
FIG. 14A is a process view illustrating cleavage processing of a semiconductor laser element.
Figure 14B:
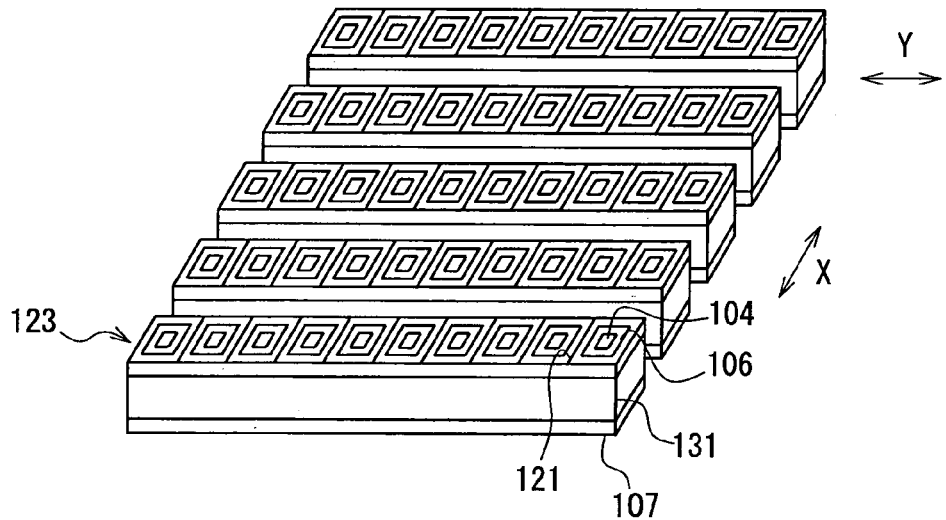
FIG. 14B is a process view illustrating cleavage processing of a semiconductor laser element.
Figure 14C:
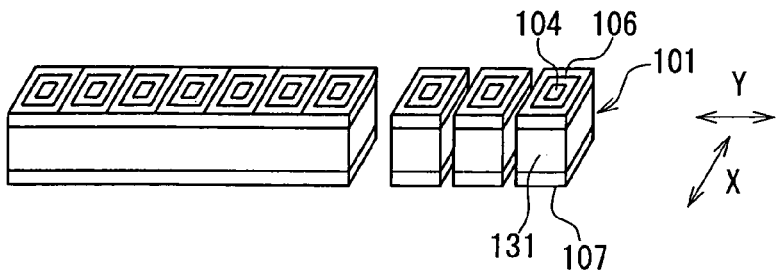
FIG. 14C is a process view illustrating cleavage processing of a semiconductor laser element.

The time, required for assembling a semiconductor laser device in the case of actually producing such a semiconductor laser device assembly apparatus and operating it, is 10 seconds/piece. On the other hand, in an device using a conventional method in which the sub-mount 102 and the semiconductor laser element 101 are placed continuously on the base 103 shown in FIGS. 12A to 12C, and thereafter, they are heated simultaneously, the required time is 27 seconds/piece. Thus, the assembly speed can be reduced to about ⅓.

In Embodiment 3, the case where AuSn alloy plating is used for the solder layers 4 and 5 has been described. AgSn may be used in the same way as in Embodiment 1. In this case, it is desirable that the metal film 10 contains Ag. According to this configuration, when the base 3 and the sub-mount 2 are bonded to each other, Ag is melted from the metal film 10 to the solder layer 5 to increase the melting point of the solder layer 5. Thus, even if the solder layers 4 and 5 have the same composition, respective bonding steps can be performed separately.

In Embodiment 3, the base 3 and the sub-mount 2, and the sub-mount 2 and the semiconductor laser element 1 are assembled separately. However, the base 3, the sub-mount 2, and the semiconductor laser element 1 may be bonded simultaneously, if required. Furthermore, the base 3 and the sub-mount 2 may be bonded to each other via the solder layer 5, after the sub-mount 2 and the semiconductor laser element 1 are bonded to each other via the solder layer 4.

Furthermore, in Embodiment 3, the sub-mount 2 and the semiconductor laser element 1 are held and pressed by the sub-mount adsorbing collet 29 and the laser element adsorbing collet 30, respectively. However, the sub-mount adsorbing collet 29 and the laser element adsorbing collet 30 may be used only for the movement of the sub-mount 2 and the semiconductor laser element 1, and the positional adjustment and fixing of the sub-mount 2 and the semiconductor laser element 1 may be performed by another mechanism.

In Embodiments 1 to 3, the case where the semiconductor laser element 1 is placed on the sub-mount 2 has been described. However, the present invention is not limited thereto. More specifically, the present invention is applicable widely to a semiconductor device with an element bonded to a sub-mount, and a production method thereof.

Furthermore, in Embodiments 1 to 3 of the present invention, although a plating layer is not formed on the surface of the sub-mount 2 opposed to the semiconductor laser element 1, the plating layer may be formed if required.

The semiconductor devices according to Embodiments 1 to 3 of the present invention can be produced with high reliability at a low cost. Furthermore, according to a method for producing a semiconductor device according to Embodiments 1 to 3 of the present invention, production yield and productivity of a semiconductor device can be enhanced.

The material and configuration specifically described in the embodiments are shown merely for an illustrative purpose, and the present invention is not limited to only these specific examples.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for producing a semiconductor device, comprising:
   forming a surface electrode on a semiconductor element;
   forming a solder layer by plating on one principal surface of the surface electrode;
   placing the semiconductor element on a sub-mount so that the solder layer contacts a principal surface of the sub-mount; and
   bonding the sub-mount and the semiconductor element to each other via the solder layer,
   wherein the solder layer is partially formed on the surface electrode, the surface electrode has an exposed portion, and before mounting the semiconductor element on the sub-mount, a covering layer having a flatness different from that of the surface electrode is formed on the solder layer.

2. The method for producing a semiconductor device according to claim 1, wherein the solder layer contains an alloy of Au and Sn.

3. The method for producing a semiconductor device according to claim 2, wherein, after the solder layer made of plating of the alloy of Au and Sn is formed, an Au-rich layer is formed on a surface of the solder layer by plating, and the Au-rich layer is subjected to etching treatment so as to be made rough.

4. The method for producing a semiconductor device according to claim 3, wherein the solder layer made of the plating of the alloy of Au and Sn is formed by allowing a current to flow through the surface electrode soaked in a plating liquid,
   a composition of the alloy of Au and Sn is changed by adjusting a current density in the plating liquid, and
   an Au-rich layer is formed as a covering layer on the surface of the solder layer.

5. The method for producing a semiconductor device according to claim 3, wherein a thickness of the Au-rich layer after the etching treatment is 0.02 μm or more.

6. The method for producing a semiconductor device according to claim 3, wherein the Au-rich layer contains Au in an amount of 90 wt % or more.

7. The method for producing a semiconductor device according to claim 3, wherein the etching treatment includes impregnating the Au-rich layer with a mixture of iodine and water, and roughening a surface of the Au-rich layer.

8. The method for producing a semiconductor device according to claim 1, wherein the solder layer contains an alloy of Ag and Sn.

9. The method for producing a semiconductor device according to claim 8, wherein, after the solder layer made of the plating of the alloy of Ag and Sn is formed, an Au-rich layer is formed on a surface of the solder layer, and etching treatment is performed so as to roughen a surface of the Au-rich layer.

10. The method for producing a semiconductor device according to claim 9, wherein the Au-rich layer is formed by plating.

11. The method for producing a semiconductor device according to claim 9, wherein the Au-rich layer is formed by vapor deposition.

12. The method for producing a semiconductor device according to claim 9, wherein a thickness of the Au-rich layer after the etching treatment is 0.02 μm or more.

13. The method for producing a semiconductor device according to claim 9, wherein the Au-rich layer contains Au in an amount of 90 wt % or more.

14. The method for producing a semiconductor device according to claim 1, wherein the semiconductor element is a semiconductor laser element.

15. The method for producing a semiconductor device according to claim 14, wherein the surface electrode is formed on a side of the semiconductor laser element on which an active layer is formed.

16. The method for producing a semiconductor device according to claim 1, wherein the surface electrode comprises a plurality of layers, and
the method further comprises forming a barrier layer for preventing metal contained in the solder layer from diffusing into the semiconductor element, as at least one layer of the surface electrode.

17. A method for producing a semiconductor device, comprising:
forming a surface electrode on a semiconductor element;
forming a solder layer by plating on one principal surface of the surface electrode;
placing the semiconductor element on a sub-mount so that the solder layer contacts a principal surface of the sub-mount;
bonding the sub-mount and the semiconductor element to each other via the solder layer; and
bonding a base and the sub-mount to each other via a solder layer for a base, before mounting the semiconductor element on the sub-mount,
wherein the solder layer for a base is formed on one of the sub-mount and the base,
a plating layer containing Au is formed on the other of the sub-mount and the base in a case where the solder layer for a base contains an alloy of Au and Sn, and a plating layer containing Ag is formed on the other of the sub-mount and the base in a case where the solder layer for a base contains an alloy of Ag and Sn, and
in order to bond the base and the sub-mount to each other, heating is performed so that the solder layer for a base and the plating layer are melted.

18. The method for producing a semiconductor device according to claim 17, wherein the semiconductor element is a semiconductor laser element.

19. The method for producing a semiconductor device according to claim 18, wherein the surface electrode is formed on a side of the semiconductor laser element on which an active layer is formed.

20. The method for producing a semiconductor device according to claim 17, wherein the surface electrode comprises a plurality of layers, and
the method further comprises forming a barrier layer for preventing metal contained in the solder layer from diffusing into the semiconductor element, as at least one layer of the surface electrode.

21. A method for producing a semiconductor device, comprising:
forming a surface electrode on a semiconductor element;
forming a solder layer by plating on one principal surface of the surface electrode;
placing the semiconductor element on a sub-mount so that the solder layer contacts a principal surface of the sub-mount;
bonding the sub-mount and the semiconductor element to each other via the solder layer; and
bonding a base and the sub-mount to each other via a solder layer for a base, after bonding the sub-mount and the semiconductor element to each other via the solder layer,
wherein the solder layer for a base is formed on one of the sub-mount and the base,
a plating layer containing Au is formed on the other of the sub-mount and the base in a case where the solder layer for a base contains an alloy of Au and Sn, and a plating layer containing Ag is formed on the other of the sub-mount and the base in a case where the solder layer for a base contains an alloy of Ag and Sn, and
in order to bond the base and the sub-mount to each other, heating is performed so that the solder layer for a base and the plating layer are melted.

22. The method for producing a semiconductor device according to claim 21, wherein the semiconductor element is a semiconductor laser element.

23. The method for producing a semiconductor device according to claim 22, wherein the surface electrode is formed on a side of the semiconductor laser element on which an active layer is formed.

24. The method for producing a semiconductor device according to claim 21, wherein the surface electrode comprises a plurality of layers, and
the method further comprises forming a barrier layer for preventing metal contained in the solder layer from diffusing into the semiconductor element, as at least one layer of the surface electrode.

25. A method for producing a semiconductor device, comprising:
forming a surface electrode on a semiconductor element;
forming a solder layer by plating on one principal surface of the surface electrode;
placing the semiconductor element on a sub-mount so that the solder layer contacts a principal surface of the sub-mount; and
bonding the sub-mount and the semiconductor element to each other via the solder layer, wherein the solder layer is partially formed on the surface electrode, the surface electrode has an exposed portion, and before mounting the semiconductor element on the sub-mount, a covering layer having a flatness different from that of the surface electrode is formed on the solder layer, and wherein an entire region for forming the solder layer on the surface electrode is inside of the principal surface of the semiconductor element where the surface electrode is formed.

26. The method for producing a semiconductor device according to claim 25, wherein the solder layer contains an alloy of Au and Sn, and a content of Sn with respect to a total amount of Au is in the vicinity of 20 wt %.

27. The method for producing a semiconductor device according to claim 25, wherein the solder layer contains an alloy of Ag and Sn, and a content of Sn with respect to a total amount of Ag is in the vicinity of 95 wt %.

28. The mehtod for producing a semiconductor device according to claim 25, wherein at least two surface electrodes are provided on the principal surface of the semiconductor element, and the solder layer is formed on each of the surface electrodes.

29. The method for producing a semiconductor device according to claim 28, wherein electrodes are provided so as to correspond to the at least two surface electrodes on a surface of the sub-mount opposed to the semiconductor element.

* * * * *